(12) United States Patent
Shih et al.

(10) Patent No.: US 10,289,251 B2
(45) Date of Patent: May 14, 2019

(54) REDUCING FLOATING GROUND EFFECTS IN PIXELATED SELF-CAPACITANCE TOUCH SCREENS

(71) Applicant: Apple Inc., Cupertino, CA (US)

(72) Inventors: David H. C. Shih, Santa Clara, CA (US); Albert Lin, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/318,157

(22) Filed: Jun. 27, 2014

(65) Prior Publication Data

US 2015/0378465 A1 Dec. 31, 2015

(51) Int. Cl.
G06F 3/041 (2006.01)
G06F 3/044 (2006.01)
H03K 17/96 (2006.01)

(52) U.S. Cl.
CPC ............ *G06F 3/044* (2013.01); *G06F 3/0412* (2013.01); *G06F 3/0416* (2013.01); *H03K 17/9622* (2013.01); *H03K 2217/96031* (2013.01)

(58) Field of Classification Search
None
See application file for complete search history.

(56) References Cited

U.S. PATENT DOCUMENTS

| 4,087,625 A | 5/1978 | Dym et al. |
| 4,090,092 A | 5/1978 | Serrano |
| 4,304,976 A | 12/1981 | Gottbreht et al. |
| 4,475,235 A | 10/1984 | Graham |
| 4,550,221 A | 10/1985 | Mabusth |
| 4,659,874 A | 4/1987 | Landmeier |
| 5,194,862 A | 3/1993 | Edwards |
| 5,317,919 A | 6/1994 | Awtrey |
| 5,459,463 A | 10/1995 | Gruaz et al. |
| 5,483,261 A | 1/1996 | Yasutake |

(Continued)

FOREIGN PATENT DOCUMENTS

| CN | 1246638 A | 3/2000 |
| CN | 1527274 A | 9/2004 |

(Continued)

OTHER PUBLICATIONS

International Search Report dated Dec. 12, 2014, for PCT Application No. PCT/US2014/56795, two pages.

(Continued)

*Primary Examiner* — David D Davis
(74) *Attorney, Agent, or Firm* — Morrison & Foerster LLP

(57) ABSTRACT

A touch controller is disclosed. In some examples, the touch controller can include sense circuitry configured to be coupled to a first touch pixel and a second touch pixel on a touch sensor panel. In some examples, the sense circuitry can be configured to drive and sense the first touch pixel during a first time period while coupling the second touch pixel to a reference voltage. In some examples, the sense circuitry can be configured to drive and sense the second touch pixel during a second time period while coupling the first touch pixel to the reference voltage. In some examples, the reference voltage can be a system ground of the touch controller. In some examples, the sense circuitry can be configured to drive and sense pluralities of touch pixels in a similar manner.

24 Claims, 6 Drawing Sheets

(56) References Cited

U.S. PATENT DOCUMENTS

| | | |
|---|---|---|
| 5,488,204 A | 1/1996 | Mead et al. |
| 5,543,590 A | 8/1996 | Gillespie et al. |
| 5,631,670 A | 5/1997 | Tomiyoshi et al. |
| 5,825,352 A | 10/1998 | Bisset et al. |
| 5,835,079 A | 11/1998 | Shieh |
| 5,841,078 A | 11/1998 | Miller et al. |
| 5,844,506 A | 12/1998 | Binstead |
| 5,880,411 A | 3/1999 | Gillespie et al. |
| 5,914,465 A | 6/1999 | Allen et al. |
| 6,057,903 A | 5/2000 | Colgan et al. |
| 6,137,427 A | 10/2000 | Binstead |
| 6,163,313 A | 12/2000 | Aroyan et al. |
| 6,188,391 B1 | 2/2001 | Seely et al. |
| 6,239,788 B1 | 5/2001 | Nohno et al. |
| 6,310,610 B1 | 10/2001 | Beaton et al. |
| 6,323,846 B1 | 11/2001 | Westerman et al. |
| 6,452,514 B1 | 9/2002 | Philipp |
| 6,456,952 B1 | 9/2002 | Nathan |
| 6,690,387 B2 | 2/2004 | Zimmerman et al. |
| 6,730,863 B1 | 5/2004 | Gerpheide et al. |
| 6,970,160 B2 | 11/2005 | Mulligan et al. |
| 7,015,894 B2 | 3/2006 | Morohoshi |
| 7,030,860 B1 | 4/2006 | Hsu et al. |
| 7,129,935 B2 | 10/2006 | Mackey |
| 7,138,686 B1 | 11/2006 | Banerjee et al. |
| 7,180,508 B2 | 2/2007 | Kent et al. |
| 7,184,064 B2 | 2/2007 | Zimmerman et al. |
| 7,337,085 B2 | 2/2008 | Soss |
| 7,412,586 B1 | 8/2008 | Rajopadhye et al. |
| 7,504,833 B1 | 3/2009 | Sequine |
| 7,538,760 B2 | 5/2009 | Hotelling et al. |
| 7,548,073 B2 | 6/2009 | Mackey et al. |
| 7,639,234 B2 | 12/2009 | Orsley |
| 7,663,607 B2 | 2/2010 | Hotelling et al. |
| 7,719,523 B2 | 5/2010 | Hillis |
| 7,701,539 B2 | 8/2010 | Shih et al. |
| 7,907,126 B2 | 3/2011 | Yoon et al. |
| 7,932,898 B2 | 4/2011 | Philipp et al. |
| 8,026,904 B2 | 9/2011 | Westerman |
| 8,040,321 B2 | 10/2011 | Peng et al. |
| 8,040,326 B2 | 10/2011 | Hotelling et al. |
| 8,045,783 B2 | 10/2011 | Lee et al. |
| 8,058,884 B2 | 11/2011 | Betancourt |
| 8,068,097 B2 | 11/2011 | GuangHai |
| 8,120,371 B2 | 2/2012 | Day et al. |
| 8,125,312 B2 | 2/2012 | Orr |
| 8,169,421 B2 | 5/2012 | Wright et al. |
| 8,223,133 B2 | 7/2012 | Hristov |
| 8,258,986 B2 | 9/2012 | Makovetskyy |
| 8,259,078 B2 | 9/2012 | Hotelling et al. |
| 8,283,935 B2 | 10/2012 | Liu et al. |
| 8,319,747 B2 | 11/2012 | Hotelling et al. |
| 8,339,286 B2 | 12/2012 | Cordeiro |
| 8,441,464 B1 | 5/2013 | Lin et al. |
| 8,479,122 B2 | 7/2013 | Hotelling et al. |
| 8,484,838 B2 | 7/2013 | Badaye et al. |
| 8,487,898 B2 | 7/2013 | Hotelling |
| 8,507,811 B2 | 8/2013 | Hotelling et al. |
| 8,508,495 B2 | 8/2013 | Hotelling et al. |
| 8,537,126 B2 | 9/2013 | Yousefpor et al. |
| 8,542,208 B2 | 9/2013 | Krah et al. |
| 8,593,410 B2 | 11/2013 | Hong et al. |
| 8,593,425 B2 | 11/2013 | Hong et al. |
| 8,614,688 B2 | 12/2013 | Chang |
| 8,680,877 B2 | 3/2014 | Lee et al. |
| 8,760,412 B2 | 6/2014 | Hotelling et al. |
| 8,773,146 B1 | 7/2014 | Hills et al. |
| 8,810,543 B1 | 8/2014 | Kurikawa |
| 8,884,917 B2 | 11/2014 | Seo |
| 8,902,172 B2 | 12/2014 | Peng et al. |
| 8,922,521 B2 | 12/2014 | Hotelling et al. |
| 8,957,874 B2 | 2/2015 | Elias |
| 8,976,133 B2 | 3/2015 | Yao et al. |
| 8,982,096 B2 | 3/2015 | Hong et al. |
| 9,001,082 B1 | 4/2015 | Rosenberg et al. |
| 9,035,895 B2 | 5/2015 | Bussat et al. |
| 9,075,463 B2 | 7/2015 | Pyo et al. |
| 9,086,774 B2 | 7/2015 | Hotelling et al. |
| 9,261,997 B2 | 2/2016 | Chang et al. |
| 9,292,137 B2 | 3/2016 | Kogo |
| 9,329,674 B2 | 5/2016 | Lee et al. |
| 9,329,723 B2 | 5/2016 | Benbasat et al. |
| 9,372,576 B2 | 6/2016 | Westerman |
| 9,582,131 B2 | 2/2017 | Elias |
| 9,690,397 B2 | 6/2017 | Shepelev et al. |
| 9,874,975 B2 | 1/2018 | Benbasat et al. |
| 9,880,655 B2 | 1/2018 | O'Connor |
| 9,886,141 B2 | 2/2018 | Yousefpor |
| 9,996,175 B2 | 6/2018 | Hotelling et al. |
| 10,001,888 B2 | 6/2018 | Hong et al. |
| 2002/0152048 A1 | 10/2002 | Hayes |
| 2003/0076325 A1 | 4/2003 | Thrasher |
| 2003/0164820 A1 | 9/2003 | Kent |
| 2003/0210235 A1 | 11/2003 | Roberts |
| 2004/0017362 A1 | 1/2004 | Mulligan et al. |
| 2004/0061687 A1 | 4/2004 | Kent et al. |
| 2004/0090429 A1 | 5/2004 | Geaghan et al. |
| 2004/0188151 A1 | 9/2004 | Gerpheide et al. |
| 2004/0239650 A1 | 12/2004 | Mackey |
| 2005/0007353 A1 | 1/2005 | Smith et al. |
| 2005/0012724 A1 | 1/2005 | Kent |
| 2005/0069718 A1 | 3/2005 | Voss-Kehl et al. |
| 2005/0073507 A1 | 4/2005 | Richter et al. |
| 2005/0083307 A1 | 4/2005 | Aufderheide et al. |
| 2005/0126831 A1 | 6/2005 | Richter et al. |
| 2005/0146509 A1 | 7/2005 | Geaghan et al. |
| 2005/0239532 A1 | 10/2005 | Inamura |
| 2005/0270039 A1 | 12/2005 | Mackey |
| 2005/0270273 A1 | 12/2005 | Marten |
| 2005/0280639 A1 | 12/2005 | Taylor et al. |
| 2006/0001640 A1 | 1/2006 | Lee |
| 2006/0017710 A1 | 1/2006 | Lee et al. |
| 2006/0038791 A1 | 2/2006 | Mackey |
| 2006/0132463 A1 | 6/2006 | Lee et al. |
| 2006/0146484 A1 | 7/2006 | Kim et al. |
| 2006/0197753 A1 | 9/2006 | Hotelling |
| 2006/0202969 A1 | 9/2006 | Hauck |
| 2006/0238522 A1 | 10/2006 | Westerman et al. |
| 2006/0267953 A1 | 11/2006 | Peterson et al. |
| 2006/0278444 A1 | 12/2006 | Binstead |
| 2006/0279548 A1 | 12/2006 | Geaghan |
| 2006/0293864 A1 | 12/2006 | Soss |
| 2007/0008299 A1 | 1/2007 | Hristov |
| 2007/0012665 A1 | 1/2007 | Nelson et al. |
| 2007/0023523 A1 | 2/2007 | Onishi |
| 2007/0074914 A1 | 4/2007 | Geaghan et al. |
| 2007/0075982 A1 | 4/2007 | Morrison et al. |
| 2007/0216637 A1 | 9/2007 | Ito |
| 2007/0216657 A1 | 9/2007 | Konicek |
| 2007/0229468 A1 | 10/2007 | Peng et al. |
| 2007/0229470 A1 | 10/2007 | Snyder et al. |
| 2007/0247443 A1 | 10/2007 | Philipp |
| 2007/0262963 A1 | 11/2007 | Xiao-Ping et al. |
| 2007/0262969 A1 | 11/2007 | Pak |
| 2007/0268273 A1 | 11/2007 | Westerman et al. |
| 2007/0268275 A1 | 11/2007 | Westerman et al. |
| 2007/0279395 A1 | 12/2007 | Philipp |
| 2007/0283832 A1 | 12/2007 | Hotelling |
| 2007/0285365 A1 | 12/2007 | Lee |
| 2008/0006454 A1 | 1/2008 | Hotelling |
| 2008/0007533 A1 | 1/2008 | Hotelling |
| 2008/0018581 A1 | 1/2008 | Park et al. |
| 2008/0024456 A1 | 1/2008 | Peng et al. |
| 2008/0036742 A1 | 2/2008 | Garmon |
| 2008/0042986 A1 | 2/2008 | Westerman et al. |
| 2008/0042987 A1 | 2/2008 | Westerman et al. |
| 2008/0042992 A1 | 2/2008 | Kim |
| 2008/0047764 A1 | 2/2008 | Lee et al. |
| 2008/0062140 A1 | 3/2008 | Hotelling et al. |
| 2008/0062148 A1 | 3/2008 | Hotelling et al. |
| 2008/0062151 A1 | 3/2008 | Kent |
| 2008/0074398 A1 | 3/2008 | Wright |
| 2008/0136787 A1 | 6/2008 | Yeh et al. |
| 2008/0136792 A1 | 6/2008 | Peng et al. |

(56) References Cited

U.S. PATENT DOCUMENTS

| | | |
|---|---|---|
| 2008/0158145 A1 | 7/2008 | Westerman |
| 2008/0158146 A1 | 7/2008 | Westerman |
| 2008/0158167 A1 | 7/2008 | Hotelling et al. |
| 2008/0158172 A1 | 7/2008 | Hotelling et al. |
| 2008/0158174 A1 | 7/2008 | Land et al. |
| 2008/0158181 A1 | 7/2008 | Hamblin et al. |
| 2008/0158182 A1 | 7/2008 | Westerman |
| 2008/0158185 A1 | 7/2008 | Westerman |
| 2008/0162996 A1 | 7/2008 | Krah et al. |
| 2008/0188267 A1 | 8/2008 | Sagong |
| 2008/0224962 A1 | 9/2008 | Kasai et al. |
| 2008/0238871 A1 | 10/2008 | Tam |
| 2008/0264699 A1 | 10/2008 | Chang et al. |
| 2008/0277259 A1 | 11/2008 | Chang |
| 2008/0283175 A1 | 11/2008 | Hagood et al. |
| 2008/0303022 A1 | 12/2008 | Tai et al. |
| 2008/0303964 A1 | 12/2008 | Lee et al. |
| 2008/0309626 A1 | 12/2008 | Westerman et al. |
| 2008/0309627 A1 | 12/2008 | Hotelling et al. |
| 2008/0309629 A1 | 12/2008 | Westerman et al. |
| 2008/0309632 A1 | 12/2008 | Westerman et al. |
| 2008/0309633 A1 | 12/2008 | Hotelling et al. |
| 2008/0309635 A1 | 12/2008 | Matsuo |
| 2009/0002337 A1 | 1/2009 | Chang |
| 2009/0019344 A1 | 1/2009 | Yoon et al. |
| 2009/0020343 A1 | 1/2009 | Rothkopf et al. |
| 2009/0070681 A1 | 3/2009 | Dawes et al. |
| 2009/0073138 A1 | 3/2009 | Lee et al. |
| 2009/0085894 A1 | 4/2009 | Gandhi et al. |
| 2009/0091551 A1 | 4/2009 | Hotelling et al. |
| 2009/0114456 A1 | 5/2009 | Wisniewski |
| 2009/0128516 A1 | 5/2009 | Rimon et al. |
| 2009/0135157 A1 | 5/2009 | Harley |
| 2009/0160787 A1 | 6/2009 | Westerman et al. |
| 2009/0174676 A1 | 7/2009 | Westerman |
| 2009/0174688 A1 | 7/2009 | Westerman |
| 2009/0182189 A1 | 7/2009 | Lira |
| 2009/0184937 A1 | 7/2009 | Grivna |
| 2009/0194344 A1 | 8/2009 | Harley et al. |
| 2009/0205879 A1 | 8/2009 | Halsey, IV et al. |
| 2009/0213090 A1 | 8/2009 | Mamba et al. |
| 2009/0236151 A1 | 9/2009 | Yeh et al. |
| 2009/0242283 A1 | 10/2009 | Chiu |
| 2009/0251427 A1 | 10/2009 | Hung et al. |
| 2009/0267902 A1 | 10/2009 | Nambu et al. |
| 2009/0267903 A1 | 10/2009 | Cady et al. |
| 2009/0273577 A1 | 11/2009 | Chen et al. |
| 2009/0303189 A1 | 12/2009 | Grunthaner et al. |
| 2009/0309850 A1 | 12/2009 | Yang |
| 2009/0315854 A1 | 12/2009 | Matsuo |
| 2009/0322702 A1 | 12/2009 | Chien et al. |
| 2010/0001973 A1* | 1/2010 | Hotelling ............ G02F 1/13338 345/174 |
| 2010/0006350 A1 | 1/2010 | Elias |
| 2010/0007616 A1 | 1/2010 | Jang |
| 2010/0039396 A1 | 2/2010 | Ho et al. |
| 2010/0059294 A1 | 3/2010 | Elias et al. |
| 2010/0060608 A1 | 3/2010 | Yousefpor |
| 2010/0079384 A1 | 4/2010 | Grivna |
| 2010/0079401 A1 | 4/2010 | Staton |
| 2010/0102027 A1 | 4/2010 | Liu et al. |
| 2010/0110035 A1 | 5/2010 | Selker |
| 2010/0117985 A1 | 5/2010 | Wadia |
| 2010/0143848 A1 | 6/2010 | Jain et al. |
| 2010/0156846 A1 | 6/2010 | Long et al. |
| 2010/0182278 A1 | 7/2010 | Li et al. |
| 2010/0194697 A1 | 8/2010 | Hotelling et al. |
| 2010/0194707 A1 | 8/2010 | Hotelling et al. |
| 2010/0245286 A1 | 9/2010 | Parker |
| 2010/0253638 A1 | 10/2010 | Yousefpor et al. |
| 2010/0328248 A1 | 12/2010 | Mozdzyn |
| 2010/0328263 A1 | 12/2010 | Lin |
| 2011/0007020 A1 | 1/2011 | Hong |
| 2011/0025623 A1 | 2/2011 | Lin |
| 2011/0025629 A1 | 2/2011 | Grivna et al. |
| 2011/0025635 A1 | 2/2011 | Lee |
| 2011/0096016 A1 | 4/2011 | Yilmaz |
| 2011/0134050 A1 | 6/2011 | Harley |
| 2011/0199105 A1 | 8/2011 | Otagaki et al. |
| 2011/0227874 A1 | 9/2011 | Faahraeus et al. |
| 2011/0231139 A1 | 9/2011 | Yokota |
| 2011/0241907 A1 | 10/2011 | Cordeiro |
| 2011/0248949 A1 | 10/2011 | Chang et al. |
| 2011/0254795 A1 | 10/2011 | Chen |
| 2011/0261005 A1 | 10/2011 | Joharapurkar et al. |
| 2011/0261007 A1 | 10/2011 | Joharapurkar et al. |
| 2011/0282606 A1 | 11/2011 | Ahed et al. |
| 2011/0298727 A1 | 12/2011 | Yousefpor et al. |
| 2011/0310033 A1 | 12/2011 | Liu et al. |
| 2011/0310064 A1 | 12/2011 | Keski-Jaskari et al. |
| 2012/0026099 A1 | 2/2012 | Harley |
| 2012/0044199 A1 | 2/2012 | Karpin et al. |
| 2012/0050206 A1 | 3/2012 | Welland |
| 2012/0050216 A1 | 3/2012 | Kremin et al. |
| 2012/0054379 A1 | 3/2012 | Leung et al. |
| 2012/0056662 A1 | 3/2012 | Wilson et al. |
| 2012/0056851 A1 | 3/2012 | Chen et al. |
| 2012/0075239 A1 | 3/2012 | Azumi et al. |
| 2012/0092288 A1 | 4/2012 | Wadia |
| 2012/0098776 A1 | 4/2012 | Chen et al. |
| 2012/0113047 A1 | 5/2012 | Hanauer et al. |
| 2012/0146726 A1* | 6/2012 | Huang ............ G06F 3/044 330/257 |
| 2012/0146942 A1 | 6/2012 | Kamoshida et al. |
| 2012/0154324 A1 | 6/2012 | Wright et al. |
| 2012/0162133 A1 | 6/2012 | Chen et al. |
| 2012/0162134 A1 | 6/2012 | Chen et al. |
| 2012/0169652 A1 | 7/2012 | Chang |
| 2012/0169653 A1 | 7/2012 | Chang |
| 2012/0169655 A1 | 7/2012 | Chang |
| 2012/0169656 A1 | 7/2012 | Chang |
| 2012/0169664 A1 | 7/2012 | Milne |
| 2012/0182251 A1 | 7/2012 | Krah |
| 2012/0211264 A1 | 8/2012 | Milne |
| 2012/0262395 A1 | 10/2012 | Chan |
| 2012/0313881 A1 | 12/2012 | Ge et al. |
| 2012/0320385 A1 | 12/2012 | Mu et al. |
| 2013/0015868 A1 | 1/2013 | Peng |
| 2013/0021291 A1 | 1/2013 | Kremin et al. |
| 2013/0027118 A1 | 1/2013 | Ho et al. |
| 2013/0027346 A1 | 1/2013 | Yarosh et al. |
| 2013/0057511 A1 | 3/2013 | Shepelev et al. |
| 2013/0069911 A1* | 3/2013 | You ............ G06F 3/042 345/175 |
| 2013/0076648 A1 | 3/2013 | Krah et al. |
| 2013/0120303 A1 | 5/2013 | Hong et al. |
| 2013/0127739 A1 | 5/2013 | Guard et al. |
| 2013/0141383 A1 | 6/2013 | Woolley |
| 2013/0154996 A1 | 6/2013 | Trend et al. |
| 2013/0173211 A1 | 7/2013 | Hoch et al. |
| 2013/0176271 A1 | 7/2013 | Sobel et al. |
| 2013/0176273 A1 | 7/2013 | Li et al. |
| 2013/0215049 A1 | 8/2013 | Lee |
| 2013/0234964 A1 | 9/2013 | Kim et al. |
| 2013/0257785 A1 | 10/2013 | Brown et al. |
| 2013/0257797 A1 | 10/2013 | Wu et al. |
| 2013/0265276 A1 | 10/2013 | Obeidat et al. |
| 2013/0271427 A1 | 10/2013 | Benbasat |
| 2013/0278447 A1 | 10/2013 | Kremin |
| 2013/0278498 A1 | 10/2013 | Jung et al. |
| 2013/0278525 A1 | 10/2013 | Lim et al. |
| 2013/0307821 A1* | 11/2013 | Kogo ............ G06F 3/044 345/174 |
| 2013/0321289 A1 | 12/2013 | Dubery et al. |
| 2013/0342479 A1 | 12/2013 | Pyo et al. |
| 2014/0002406 A1 | 1/2014 | Cormier et al. |
| 2014/0009438 A1 | 1/2014 | Liu et al. |
| 2014/0022201 A1 | 1/2014 | Boychuk |
| 2014/0043546 A1 | 2/2014 | Yamazaki et al. |
| 2014/0071084 A1 | 3/2014 | Sugiura |
| 2014/0078096 A1 | 3/2014 | Tan et al. |
| 2014/0104225 A1 | 4/2014 | Davidson et al. |
| 2014/0104228 A1 | 4/2014 | Chen et al. |
| 2014/0125628 A1 | 5/2014 | Yoshida et al. |

(56) References Cited

U.S. PATENT DOCUMENTS

| | | | |
|---|---|---|---|
| 2014/0132560 A1 | 5/2014 | Huang et al. |
| 2014/0145997 A1 | 5/2014 | Tiruvuru |
| 2014/0152615 A1 | 6/2014 | Chang et al. |
| 2014/0160058 A1 | 6/2014 | Chen et al. |
| 2014/0168540 A1 | 6/2014 | Wang et al. |
| 2014/0240291 A1 | 8/2014 | Nam |
| 2014/0247245 A1 | 9/2014 | Lee |
| 2014/0253470 A1 | 9/2014 | Havilio |
| 2014/0267070 A1 | 9/2014 | Shahparnia et al. |
| 2014/0267146 A1 | 9/2014 | Chang et al. |
| 2014/0285469 A1 | 9/2014 | Wright et al. |
| 2014/0347574 A1 | 11/2014 | Tung et al. |
| 2014/0362034 A1 | 12/2014 | Mo et al. |
| 2014/0368436 A1 | 12/2014 | Abzarian et al. |
| 2014/0368460 A1 | 12/2014 | Mo et al. |
| 2014/0375598 A1 | 12/2014 | Shen et al. |
| 2014/0375603 A1 | 12/2014 | Hotelling et al. |
| 2014/0375903 A1 | 12/2014 | Westhues et al. |
| 2015/0002176 A1 | 1/2015 | Kwon et al. |
| 2015/0002448 A1 | 1/2015 | Brunet et al. |
| 2015/0002464 A1 | 1/2015 | Nishioka et al. |
| 2015/0015528 A1 | 1/2015 | Vandermeijden |
| 2015/0026398 A1 | 1/2015 | Kim |
| 2015/0042600 A1 | 2/2015 | Lukanc et al. |
| 2015/0042607 A1 | 2/2015 | Takanohashi |
| 2015/0049043 A1 | 2/2015 | Yousefpor |
| 2015/0049044 A1 | 2/2015 | Yousefpor |
| 2015/0077375 A1 | 3/2015 | Hotelling et al. |
| 2015/0091587 A1 | 4/2015 | Shepelev et al. |
| 2015/0091849 A1 | 4/2015 | Ludden |
| 2015/0103047 A1 | 4/2015 | Hanauer et al. |
| 2015/0116263 A1 | 4/2015 | Kim |
| 2015/0123939 A1 | 5/2015 | Kim et al. |
| 2015/0227240 A1 | 8/2015 | Hong et al. |
| 2015/0242028 A1 | 8/2015 | Roberts et al. |
| 2015/0248177 A1 | 9/2015 | Maharyta |
| 2015/0253907 A1 | 9/2015 | Elias |
| 2015/0268789 A1 | 9/2015 | Liao et al. |
| 2015/0268795 A1 | 9/2015 | Kurasawa et al. |
| 2015/0309610 A1 | 10/2015 | Rabii et al. |
| 2015/0338937 A1 | 11/2015 | Shepelev et al. |
| 2015/0370387 A1 | 12/2015 | Yamaguchi et al. |
| 2016/0018348 A1 | 1/2016 | Yau et al. |
| 2016/0062533 A1 | 3/2016 | O'Connor |
| 2016/0139728 A1 | 5/2016 | Jeon et al. |
| 2016/0154505 A1 | 6/2016 | Chang et al. |
| 2016/0154529 A1 | 6/2016 | Westerman |
| 2016/0224177 A1 | 8/2016 | Krah |
| 2016/0224189 A1 | 8/2016 | Yousefpor et al. |
| 2016/0246423 A1 | 8/2016 | Fu |
| 2016/0266676 A1 | 9/2016 | Wang et al. |
| 2016/0266679 A1 | 9/2016 | Shahparnia et al. |
| 2016/0283023 A1 | 9/2016 | Shin et al. |
| 2016/0299603 A1 | 10/2016 | Tsujioka et al. |
| 2016/0357344 A1 | 12/2016 | Benbasat et al. |
| 2017/0090619 A1 | 3/2017 | Yousefpor |
| 2017/0097703 A1 | 4/2017 | Lee |
| 2017/0139539 A1 | 5/2017 | Yao et al. |
| 2017/0168626 A1 | 6/2017 | Konicek |
| 2017/0285804 A1 | 10/2017 | Yingxuan et al. |
| 2018/0067584 A1 | 3/2018 | Zhu et al. |
| 2018/0275824 A1 | 9/2018 | Li et al. |
| 2018/0307374 A1 | 10/2018 | Shah et al. |
| 2018/0307375 A1 | 10/2018 | Shah et al. |

FOREIGN PATENT DOCUMENTS

| | | |
|---|---|---|
| CN | 1672119 A | 9/2005 |
| CN | 1689677 A | 11/2005 |
| CN | 1711520 A | 12/2005 |
| CN | 1782837 A | 6/2006 |
| CN | 1818842 A | 8/2006 |
| CN | 1864124 A | 11/2006 |
| CN | 1945516 A | 4/2007 |
| CN | 101046720 A | 10/2007 |
| CN | 101071354 A | 11/2007 |
| CN | 101419516 A | 4/2009 |
| CN | 102023768 A | 4/2011 |
| CN | 103049148 A | 4/2013 |
| CN | 103294321 A | 9/2013 |
| CN | 103809810 A | 5/2014 |
| CN | 104020908 A | 9/2014 |
| DE | 11 2008 001 245 T5 | 3/2010 |
| EP | 0 853 230 A1 | 7/1998 |
| EP | 1 192 585 A1 | 4/2002 |
| EP | 1 192 585 B1 | 4/2002 |
| EP | 1 573 706 A2 | 2/2004 |
| EP | 1 573 706 A3 | 2/2004 |
| EP | 1 455 264 A2 | 9/2004 |
| EP | 1 455 264 A3 | 9/2004 |
| EP | 1 644 918 A2 | 12/2004 |
| EP | 1 717 677 A2 | 11/2006 |
| EP | 1 717 677 A3 | 11/2006 |
| EP | 1 986 084 A1 | 10/2008 |
| EP | 2 077 489 A1 | 7/2009 |
| EP | 2 256 606 A2 | 12/2010 |
| GB | 1 546 317 A | 5/1979 |
| GB | 2 144 146 A | 2/1985 |
| GB | 2 428 306 A | 1/2007 |
| GB | 2 437 827 A | 11/2007 |
| GB | 2 450 207 A | 12/2008 |
| JP | 2000-163031 A | 6/2000 |
| JP | 2002-342033 A | 11/2002 |
| JP | 2004-503835 A | 2/2004 |
| JP | 2005-084128 A | 3/2005 |
| JP | 2005-301373 A | 10/2005 |
| JP | 2007-018515 A | 1/2007 |
| JP | 2008-510251 A | 4/2008 |
| JP | 2008-225415 A | 9/2008 |
| KR | 10-20040071728 A | 10/2004 |
| KR | 10-20070002327 A | 1/2007 |
| KR | 10-2008-0019125 A | 3/2008 |
| KR | 10-2013-0094495 | 8/2013 |
| KR | 10-2013-0117499 | 10/2013 |
| KR | 10-2014-0074454 | 6/2014 |
| KR | 10-1609992 B1 | 4/2016 |
| TW | 200715015 A | 4/2007 |
| TW | 200826032 A | 6/2008 |
| TW | 2008-35294 A | 8/2008 |
| TW | M341273 U | 9/2008 |
| TW | M344522 | 11/2008 |
| TW | M344544 | 11/2008 |
| TW | 201115442 A1 | 5/2011 |
| TW | 201401129 A | 1/2014 |
| TW | 201419071 A | 5/2014 |
| WO | WO-99/35633 A2 | 7/1999 |
| WO | WO-99/35633 A3 | 7/1999 |
| WO | WO-01/097204 A1 | 12/2001 |
| WO | WO-2005/114369 A2 | 12/2005 |
| WO | WO-2005/114369 A3 | 12/2005 |
| WO | WO-2006/020305 A2 | 2/2006 |
| WO | WO-2006/020305 A3 | 2/2006 |
| WO | WO-2006/023147 A2 | 3/2006 |
| WO | WO-2006/023147 A3 | 3/2006 |
| WO | WO-2006/104745 A2 | 10/2006 |
| WO | WO-2006/104745 A3 | 10/2006 |
| WO | WO-2006/130584 A2 | 12/2006 |
| WO | WO-2006/130584 A3 | 12/2006 |
| WO | WO-2007/012899 A1 | 2/2007 |
| WO | WO-2007/034591 A1 | 3/2007 |
| WO | WO-2007/066488 A1 | 6/2007 |
| WO | WO-2007/089766 A2 | 8/2007 |
| WO | WO/2007/089766 A3 | 8/2007 |
| WO | WO-2007/115032 A2 | 10/2007 |
| WO | WO-2007/146785 A2 | 12/2007 |
| WO | WO-2007/146785 A3 | 12/2007 |
| WO | WO-2008/007118 A2 | 1/2008 |
| WO | WO-2008/007118 A3 | 1/2008 |
| WO | WO-2008/047990 A1 | 4/2008 |
| WO | WO-2008/076237 A2 | 6/2008 |
| WO | WO-2008/108514 A1 | 9/2008 |
| WO | WO-2008/135713 A1 | 11/2008 |
| WO | WO-2009/046363 A1 | 4/2009 |
| WO | WO-2009/103946 A1 | 8/2009 |

(56) References Cited

FOREIGN PATENT DOCUMENTS

| WO | WO-2009/132146 A1 | 10/2009 |
| --- | --- | --- |
| WO | WO-2009/132150 A1 | 10/2009 |
| WO | WO-2010/088659 A1 | 8/2010 |
| WO | WO-2010/117882 A2 | 10/2010 |
| WO | WO-2011/137200 A1 | 11/2011 |
| WO | WO-2013/158570 A1 | 10/2013 |
| WO | WO-2014/127716 A1 | 8/2014 |
| WO | WO-2015/017196 A1 | 2/2015 |
| WO | WO-2015/023410 A1 | 2/2015 |
| WO | WO-2015/072722 A1 | 5/2015 |
| WO | WO-2015/107969 A1 | 7/2015 |
| WO | WO-2015/178920 A1 | 11/2015 |
| WO | WO-2016/048269 A1 | 3/2016 |
| WO | WO-2016/069642 A1 | 5/2016 |
| WO | WO-2016/126525 A1 | 8/2016 |
| WO | WO-2016/144437 A1 | 9/2016 |
| WO | WO-2017/058415 A2 | 4/2017 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.
Rubine, D.H. (May 1992). "Combining Gestures and Direct Manipulation," CHI '92, pp. 659-660.
Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.
European Search Report dated Aug. 31, 2015, for EP Application No. 15166813.4, eight pages.
Cassidy, R. (Feb. 23, 2007). "The Tissot T-Touch Watch—A Groundbreaking Timepiece," located at <http://ezinearticles.com/?The-Tissot-T-Touch-Watch---A-Groundbreaking-Timepiece&id . . . >, last visited Jan. 23, 2009, two pages.
Chinese Search Report completed Dec. 14, 2011, for CN Patent Application No. ZL201020108330X, filed Feb. 2, 2010, with English Translation, 22 pages.
Chinese Search Report completed May 18, 2015, for CN Patent Application No. 201310042816.6, filed Feb. 2, 2010, two pages.
European Search Report dated Jul. 21, 2010, for EP Patent Application 10151969.2, six pages.
European Search Report dated Apr. 25, 2012, for EP Patent Application No. 08022505.5, 12 pages.
European Search Report dated Dec. 3, 2012, for EP Patent Application No. 12162177.5, seven pages.
European Search Report dated Feb. 13, 2013, for EP Patent Application No. 12192450.0, six pages.
Final Office Action dated Jan. 5, 2012, for U.S. Appl. No. 12/206,680, filed Sep. 8, 2008, 15 pages.
Final Office Action dated Jan. 3, 2013, for U.S. Appl. No. 11/818,498, filed Jun. 13, 2007, 17 pages.
Final Office Action dated Feb. 1, 2013, for U.S. Appl. No. 12/642,466, filed Dec. 18, 2009, nine pages.
Final Office Action dated Feb. 5, 2013, for U.S. Appl. No. 12/500,911, filed Jul. 10, 2009, 15 pages.
Final Office Action dated Apr. 30, 2013, for U.S. Appl. No. 12/494,173, filed Jun. 29, 2009, 7 pages.
Final Office Action dated May 22, 2013, for U.S. Appl. No. 12/206,680, filed Sep. 8, 2008, 16 pages.
Final Office Action dated Jun. 21, 2013, for U.S. Appl. No. 12/545,754 filed Aug. 21, 2009, 6 pages.
Final Office Action dated Jul. 19, 2013, for U.S. Appl. No. 12,545/604, filed Aug. 21, 2009, 17 pages.
Final Office Action dated Aug. 12, 2013, for U.S. Appl. No. 12/238,333, filed Sep. 25, 2008, 19 pages.
Final Office Action dated Aug. 13, 2013, for U.S. Appl. No. 12/238,342, filed Sep. 25, 2008, 14 pages.
Final Office Action dated Jan. 27, 2014, for U.S. Appl. No. 12/206,680, filed Sep. 8, 2008, 20 pages.
Final Office Action dated Apr. 23, 2014 for U.S. Appl. No. 12/847,987 filed Jul. 30, 2010, 16 pages.
Final Office Action dated May 9, 2014, for U.S. Appl. No. 12/642,466, filed Dec. 18, 2009, 13 pages.
Final Office Action dated Jul. 16, 2014, for U.S. Appl. No. 12/545,604, filed Aug. 21, 2009, 18 pages.
Final Office Action dated Oct. 22, 2014, for U.S. Appl. No. 12/238,342, filed Sep. 25, 2008, 16 pages.
Final Office Action dated Oct. 22, 2014, for U.S. Appl. No. 13/448,182, filed Apr. 16, 2012, 11 pages.
Final Office Action dated Apr. 22, 2015, for U.S. Appl. No. 12/238,333, filed Sep. 25, 2008, 23 pages.
Final Office Action dated Jun. 11, 2015, for U.S. Appl. No. 13/448,182, filed Apr. 16, 2012, 12 pages.
Final Office Action dated Nov. 12, 2015, for U.S. Appl. No. 14/082,074, filed Nov. 15, 2013, 22 pages.
Final Office Action dated Jan. 4, 2016, for U.S. Appl. No. 14/082,003, filed Nov. 15, 2013, 25 pages.
Final Office Action dated Jan. 29, 2016, for U.S. Appl. No. 12/642,466, filed Dec. 18, 2009, nine pages.
International Search Report dated Mar. 10, 2010, for PCT Application No. PCT/US2010/22868, filed Feb. 2, 2010, three pages.
International Search Report dated Jan. 14, 2011, for PCT Application No. PCT/US2010/029698, filed Apr. 1, 2010, 4 pages.
International Search Report dated May 2, 2011, for PCT Application No. PCT/US2010/058988, filed Dec. 3, 2010, five pages.
International Search Report dated Aug. 6, 2013, for PCT Application No. PCT/US2013/036662, filed Apr. 15, 2013, three pages.
International Search Report dated Sep. 24, 2014, for PCT Application No. PCT/US/2014/39245, three pages.
International Search Report dated Jan. 29, 2015, for PCT Application No. PCT/US2014/047888, filed Jul. 23, 2014, six pages.
International Search Report dated Jan. 8, 2016, for PCT Application No. PCT/US2015/057644, filed Oct. 27, 2015, four pages.
Malik, S. et al. (2004). "Visual Touchpad: A Two-Handed Gestural Input Device," *Proceedings of the 6th International Conference on Multimodal Interfaces*, State College, PA, Oct. 13-15, 2004, *ICMI '04, ACM* pp. 289-296.
Non-Final Office Action dated Jun. 9, 2011, for U.S. Appl. No. 12/206,680, filed Sep. 8, 2008, 13 pages.
Non-Final Office Action dated Mar. 9, 2012, for U.S. Appl. No. 12/238,342, filed Sep. 25, 2008, 26 pgs.
Non-Final Office Action dated May 3, 2012, for U.S. Appl. No. 12/238,333, filed Sep. 25, 2008, 22 pgs.
Non-Final Office Action dated May 25, 2012, for U.S. Appl. No. 11/818,498, filed Jun. 13, 2007, 16 pages.
Non-Final Office Action dated Jun. 7, 2012, for U.S. Appl. No. 12/500,911, filed Jul. 10, 2009, 16 pages.
Non-Final Office Action dated Aug. 28, 2012, for U.S. Appl. No. 12/642,466, filed Dec. 18, 2009, nine pages.
Non-Final Office Action dated Sep. 26, 2012, for U.S. Appl. No. 12/206,680, filed Sep. 8, 2008, 14 pages.
Non-Final Office Action dated Oct. 5, 2012, for U.S. Appl. No. 12/545,754, filed Aug. 21, 2009, 10 pages.
Non-Final Office Action dated Nov. 23, 2012, for U.S. Appl. No. 12/545,557, filed Aug. 21, 2009, 11 pages.
Non-Final Office Action dated Nov. 28, 2012, for U.S. Appl. No. 12/494,173, filed Jun. 29, 2009, six pages.
Non-Final Office Action dated Jan. 7, 2013, for U.S. Appl. No. 12/238,333, filed Sep. 25, 2008, 20 pgs.
Non-Final office Action dated Jan. 7, 2013, for U.S. Appl. No. 12/545,604, filed Aug. 21, 2009, 12 pages.
Non-Final Office Action dated Feb. 15, 2013, for U.S. Appl. No. 12/238,342, filed Sep. 25, 2008, 15 pages.
Non-Final Office Action dated Mar. 29, 2013 for U.S. Appl. No. 13/737,779 filed Jan. 9, 2013, nine pages.

(56) References Cited

OTHER PUBLICATIONS

Non-Final Office Action dated Sep. 6, 2013, for U.S. Appl. No. 12/847,987, filed Jul. 30, 2010, 15 pages.
Non-Final Office Action dated Sep. 10, 2013, for U.S. Appl. No. 12/545,754, filed Aug. 21, 2009, six pages.
Non-Final Office Action dated Sep. 30, 2013, for U.S. Appl. No. 12/206,680, filed Sep. 8, 2008, 18 pages.
Non-Final Office Action dated Nov. 8, 2013, for U.S. Appl. No. 12/642,466, filed Dec. 18, 2009, 12 pages.
Non-Final Office Action dated Dec. 19, 2013, for U.S. Appl. No. 12/545,604, filed Aug. 21, 2009, 17 pages.
Non-Final Office Action dated Jan. 2, 2014, for U.S. Appl. No. 12/545,754, filed Aug. 21, 2009, 11 pages.
Non-Final Office Action dated Jan. 3, 2014, for U.S. Appl. No. 12/545,557, filed Aug. 21, 2009, 9 pages.
Non-Final Office Action dated Jan. 31, 2014, for U.S. Appl. No. 13/448,182, filed Apr. 16, 2012, 18 pages.
Non-Final Office Action dated Mar. 12, 2014, for U.S. Appl. No. 12/238,342, filed Sep. 25, 2008, 15 pages.
Non-Final Office Action dated Apr. 10, 2014, for U.S. Appl. No. 14/055,717, filed Oct. 16, 2013, 10 pages.
Non-Final Office Action dated Sep. 18, 2014, for U.S. Appl. No. 12/238,333, filed Sep. 25, 2008, 21 pages.
Non-Final Office Action dated Apr. 10, 2015, for U.S. Appl. No. 14/082,074, filed Nov. 15, 2013, 23 pages.
Non-Final Office Action dated May 4, 2015, for U.S. Appl. No. 12/642,466, filed Dec. 18, 2009, nine pages.
Non-Final Office Action dated May 8, 2015, for U.S. Appl. No. 14/082,003, filed Nov. 15, 2013, 25 pages.
Non-Final Office Action dated Aug. 20, 2015 , for U.S. Appl. No. 14/550,686, filed Nov. 21, 2014, ten pages.
Non-Final Office Action dated Oct. 5, 2015, for U.S. Appl. No. 13/899,391, filed May 21, 2013, ten pages.
Non-Final Office Action dated Oct. 27, 2015, for U.S. Appl. No. 14/645,120, filed Mar. 11, 2015, eight pages.
Notice of Allowance dated Jun. 10, 2013, for U.S. Appl. No. 12/545,557, filed Aug. 21, 2009, 9 pages.
Notice of Allowance dated Aug. 19, 2013, for U.S. Appl. No. 12/500,911, filed Jul. 10, 2009, six pages.
Notice of Allowance dated Sep. 3, 2013, for U.S. Appl. No. 13/737,779, filed Jan. 9, 2013, 10 pages.
Notice of Allowance dated Apr. 11, 2014, for U.S. Appl. No. 12/545,557, filed Aug. 21, 2009, 9 pages.
Notice of Allowance dated Aug. 21, 2014, for U.S. Appl. No. 12/545,754, filed Aug. 21, 2009, 8 pages.
Notice of Allowance dated Oct. 15, 2014, for U.S. Appl. No. 12/494,173, filed Jun. 29, 2009, eight pages.
Notice of Allowance dated Nov. 7, 2014, for U.S. Appl. No. 14/055,717, filed Oct. 16, 2013, six pages.
Notice of Allowance dated Mar. 16, 2015, for U.S. Appl. No. 14/312,489, filed Jun. 23, 2014, 10 pages.
Notice of Allowance dated Dec. 1, 2015, for U.S. Appl. No. 12/238,333, filed Sep. 25, 2008, nine pages.
Notice of Allowance dated Jan. 8, 2016, for U.S. Appl. No. 13/448,182, filed Apr. 16, 2012, nine pages.
Rekimoto, J. (2002). "SmartSkin: An Infrastructure for Freehand Manipulation on Interactive Surfaces," *CHI 2002*, Apr. 20-25, 2002. [(Apr. 20, 2002). 4(1):113-120.].
Search Report dated Nov. 12, 2015, for ROC (Taiwan) Patent Application No. 103105965, with English translation, two pages.
Search Report dated Apr. 29, 2009, for NL Application No. 2001672, with English translation of Written Opinion, eight pages.
Search Report dated Oct. 14, 2015, for TW Application No. 103116003, one page.
Wilson, A.D. (Oct. 15, 2006). "Robust Computer Vision-Based Detection of Pinching for One and Two-Handed Gesture Input," *ACM, USIT* '06, Montreux, Switzerland, Oct. 15-18, 2006, pp. 255-258.

Yang, J-H. et al. (Jul. 2013). "A Noise-Immune High-Speed Readout Circuit for In-Cell Touch Screen Panels," *IEEE Transactions on Circuits and Systems-1: Regular Papers* 60(7):1800-1809.
Final Office Action dated Apr. 8, 2016, for U.S. Appl. No. 13/899,391, filed May 21, 2013, ten pages.
Final Office Action dated May 27, 2016, for U.S. Appl. No. 14/645,120, filed Mar. 11, 2015, twelve pages.
Final Office Action dated Jun. 14, 2016, for U.S. Appl. No. 14/550,686, filed Nov. 21, 2014, ten pages.
Final Office Action dated Sep. 29, 2016, for U.S. Appl. No. 14/558,529, filed Dec. 2, 2014, 22 pages.
Final Office Action dated Nov. 4, 2016, for U.S. Appl. No. 14/082,003, filed Nov. 15, 2013, 18 pages.
International Search Report dated May 9, 2016, for PCT Application No. PCT/US2016/015479, filed Jan. 28, 2016, five pages.
International Search Report dated May 11, 2016, for PCT Application No. PCT/US2016/016011, filed Feb. 1, 2016, six pages.
Non-Final Office Action dated Apr. 14, 2016, for U.S. Appl. No. 14/558,529, filed Dec. 2, 2014, 20 pages.
Non-Final Office Action dated May 25, 2016, for U.S. Appl. No. 14/082,003, filed Nov. 15, 2013, 23 pages.
Non-Final Office Action dated Jun. 1, 2016, for U.S. Appl. No. 14/615,186, filed Feb. 5, 2015, eight pages.
TW Search Report dated May 3, 2016, for TW Application No. 104115152, one page.
Non-Final Office Action dated Dec. 16, 2016, for U.S. Appl. No. 14/645,120, filed Mar. 11, 2015, ten pages.
Non-Final Office Action dated Mar. 13, 2017, for U.S. Appl. No. 14/082,003, filed Nov. 15, 2013, 20 pages.
Non-Final Office Action dated Apr. 7, 2017, for U.S. Appl. No. 15/144,706, filed May 2, 2016, eight pages.
Non-Final Office Action dated Dec. 14, 2016, for U.S. Appl. No. 14/550,686, filed Nov. 21, 2014, eight pages.
Notice of Allowance dated Dec. 2, 2016, for U.S. Appl. No. 14/615,186, filed Feb. 5, 2015, seven pages.
Final Office Action dated Aug. 16, 2018, for U.S. Appl. No. 14/993,017, filed Jan. 11, 2016, 35 pages.
European Search Report dated Jul. 27, 2017, for EP Application No. 14902458.0, four pages.
European Search Report dated Jan. 31, 2018, for EP Application No. 17183937.6, four pages.
Final Office Action dated Aug. 10, 2017, for U.S. Appl. No. 14/645,120, filed Mar. 11, 2015, twelve pages.
Final Office Action dated Aug. 21, 2017, for U.S. Appl. No. 14/550,686, filed Nov. 21, 2014, 11 pages.
Final Office Action dated Dec. 5, 2017, for U.S. Appl. No. 15/006,987, filed Jan. 26, 2016, 16 pages.
Final Office Action dated May 14, 2018, for U.S. Appl. No. 15/006,987, filed Jan. 26, 2016, 11 pages.
Final Office Action dated May 17, 2018, for U.S. Appl. No. 15/017,463, filed Feb. 5, 2016, 22 pages.
Final Office Action dated Jul. 27, 2018, for U.S. Appl. No. 15/097,179, filed Apr. 12, 2016, 11 pages.
Non-Final Office Action dated Jun. 14, 2017, for U.S. Appl. No. 15/006,987, filed Jan. 26, 2016, 14 pages.
Non-Final Office Action dated Jun. 26, 2017, for U.S. Appl. No. 14/558,529, filed Dec. 2, 2014, six pages.
Non-Final Office Action dated Sep. 14, 2017 , for U.S. Appl. No. 15/017,463, filed Feb. 5, 2016, 22 pages.
Non-Final Office Action dated Dec. 22, 2017 , for U.S. Appl. No. 14/993,017, filed Jan. 11, 2016, 23 pages.
Non-Final Office Action dated Jan. 22, 2018 , for U.S. Appl. No. 15/097,179, filed Apr. 12, 2016, 11 pages.
Non-Final Office Action dated Jun. 20, 2018, for U.S. Appl. No. 15/009,774, filed Jan. 28, 2016, seventeen pages.
Notice of Allowance dated Sep. 20, 2017, for U.S. Appl. No. 14/082,003, filed Nov. 15, 2013, eight pages.
Notice of Allowance dated Sep. 20, 2017, for U.S. Appl. No. 15/144,706, filed May 2, 2016, nine pages.
Notice of Allowance dated Oct. 3, 2017, for U.S. Appl. No. 14/082,003, filed Nov. 15, 2013, nine pages.
Notice of Allowance dated Oct. 13, 2017, for U.S. Appl. No. 14/558,529, filed Dec. 2, 2014, eight pages.

(56) References Cited

OTHER PUBLICATIONS

Notice of Allowance dated Feb. 9, 2018, for U.S. Appl. No. 14/550,686, filed Nov. 21, 2014, eleven pages.
Notice of Allowance dated Mar. 1, 2018, for U.S. Appl. No. 14/645,120, filed Mar. 11, 2015, five pages.

* cited by examiner

REDUCING FLOATING GROUND EFFECTS IN PIXELATED SELF-CAPACITANCE TOUCH SCREENS

FIELD OF THE DISCLOSURE

This relates generally to touch sensor panels, and more particularly to reducing floating ground effects in a touch screen.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing electrical fields used to detect touch can extend beyond the surface of the display, and objects approaching near the surface may be detected near the surface without actually touching the surface.

Capacitive touch sensor panels can be formed by a matrix of substantially transparent conductive plates made of materials such as Indium Tin Oxide (ITO). It is due in part to their substantial transparency that capacitive touch sensor panels can be overlaid on a display to form a touch screen, as described above. Some touch screens can be formed by partially integrating touch sensing circuitry into a display pixel stackup (i.e., the stacked material layers forming the display pixels).

SUMMARY OF THE DISCLOSURE

Some capacitive touch sensor panels can be formed by a matrix of substantially transparent conductive plates made of materials such as Indium Tin Oxide (ITO), and some touch screens can be formed by partially integrating touch sensing circuitry into a display pixel stackup (i.e., the stacked material layers forming the display pixels). Touch events can be sensed on the above touch sensor panels by detecting changes in the self-capacitance of the conductive plates. Sometimes, a ground reference of touch sensing circuitry used to sense the touch events can be somewhat floating with respect to earth ground, which can cause undesirable changes in touch sensing signals. The examples of the disclosure provide various techniques for reducing the effects of such floating ground references in a touch sensing system. In some examples, one or more touch pixels on the touch sensor panel can be driven and sensed while other touch pixels on the touch sensor panel can be coupled to a reference voltage (e.g., a ground reference). In some examples, routing coupled to the touch pixels on the touch sensor panel can be configured to reduce routing-to-routing parasitic capacitances. In some examples, various other touch pixel driving schemes can be utilized to reduce the effects of floating ground references.

DETAILED DESCRIPTION

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

Some capacitive touch sensor panels can be formed by a matrix of substantially transparent conductive plates made of materials such as Indium Tin Oxide (ITO), and some touch screens can be formed by partially integrating touch sensing circuitry into a display pixel stackup (i.e., the stacked material layers forming the display pixels). Touch events can be sensed on the above touch sensor panels by detecting changes in the self-capacitance of the conductive plates. Sometimes, a ground reference of touch sensing circuitry used to sense the touch events can be somewhat floating with respect to earth ground, which can cause undesirable changes in touch sensing signals. The examples of the disclosure provide various techniques for reducing the effects of such floating ground references in a touch sensing system. In some examples, one or more touch pixels on the touch sensor panel can be driven and sensed while other touch pixels on the touch sensor panel can be coupled to a reference voltage (e.g., a ground reference). In some examples, routing coupled to the touch pixels on the touch sensor panel can be configured to reduce routing-to-routing parasitic capacitances. In some examples, various other touch pixel driving schemes can be utilized to reduce the effects of floating ground references.

Figure 1A:
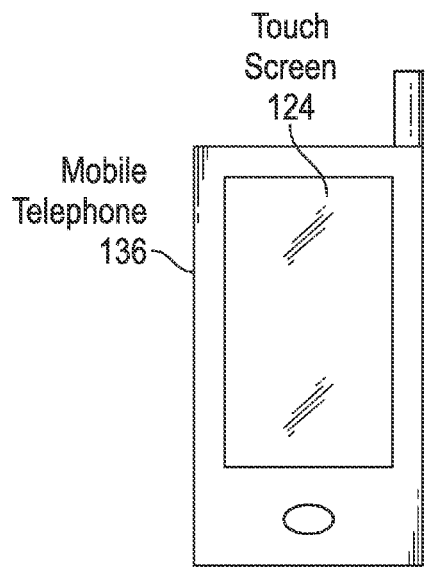
FIGS. 1A-1D illustrate an example mobile telephone, an example media player, an example personal computer and an example tablet computer that can each include an exemplary touch screen according to examples of the disclosure.
Figure 1B:
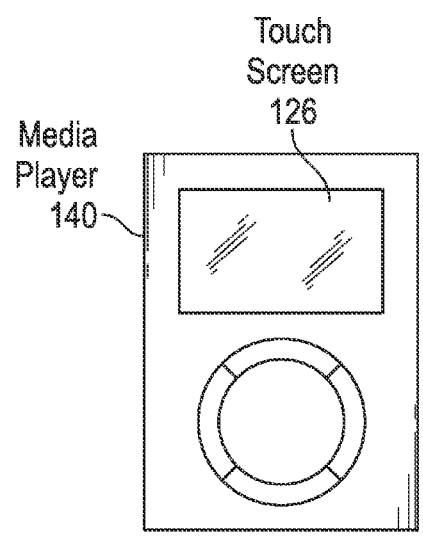
Figure 1C:
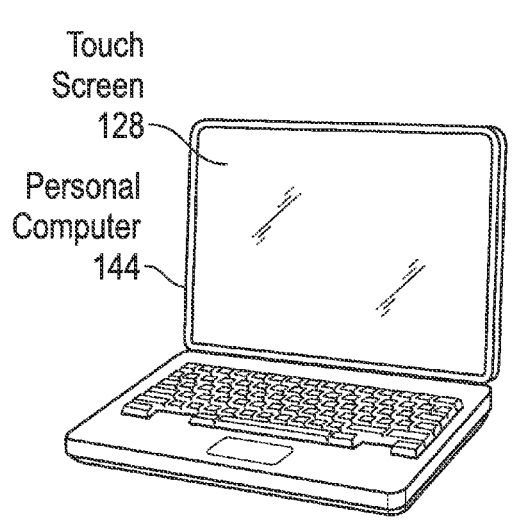
Figure 1D:
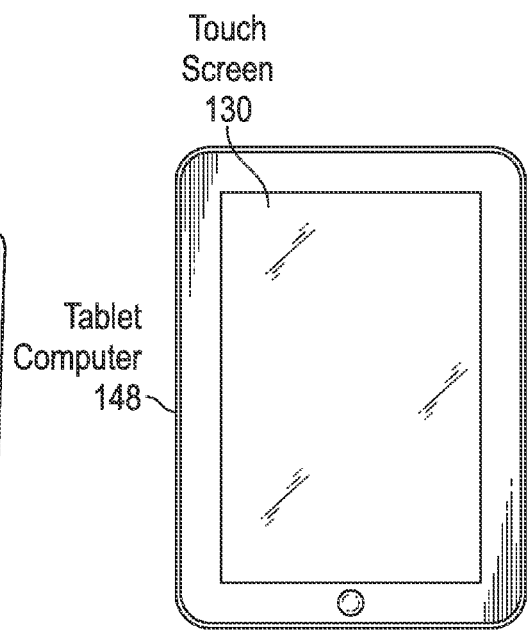

FIGS. 1A-1D show example systems in which a touch screen according to examples of the disclosure may be implemented. FIG. 1A illustrates an example mobile telephone 136 that includes a touch screen 124. FIG. 1B illustrates an example digital media player 140 that includes a touch screen 126. FIG. 1C illustrates an example personal computer 144 that includes a touch screen 128. FIG. 1D illustrates an example tablet computer 148 that includes a touch screen 130. It is understood that the above touch screens can be implemented in other devices as well, including in wearable devices.

In some examples, touch screens 124, 126, 128 and 130 can be based on self-capacitance. A self-capacitance based touch system can include a matrix of small plates of conductive material that can be referred to as a touch pixel or a touch pixel electrode. For example, a touch screen can include a plurality of touch pixels, each touch pixel corresponding to a particular location on the touch screen at which touch or proximity (i.e., a touch or proximity event) is to be sensed. Such a touch screen can be referred to as a pixelated self-capacitance touch screen. During operation, the touch pixel can be stimulated with an AC waveform, and the self-capacitance of the touch pixel can be measured. As an object approaches the touch pixel, the self-capacitance of the touch pixel can change. This change in the self-capacitance of the touch pixel can be detected and measured by the touch sensing system to determine the positions of multiple objects when they touch, or come in proximity to, the touch screen.

Figure 2:
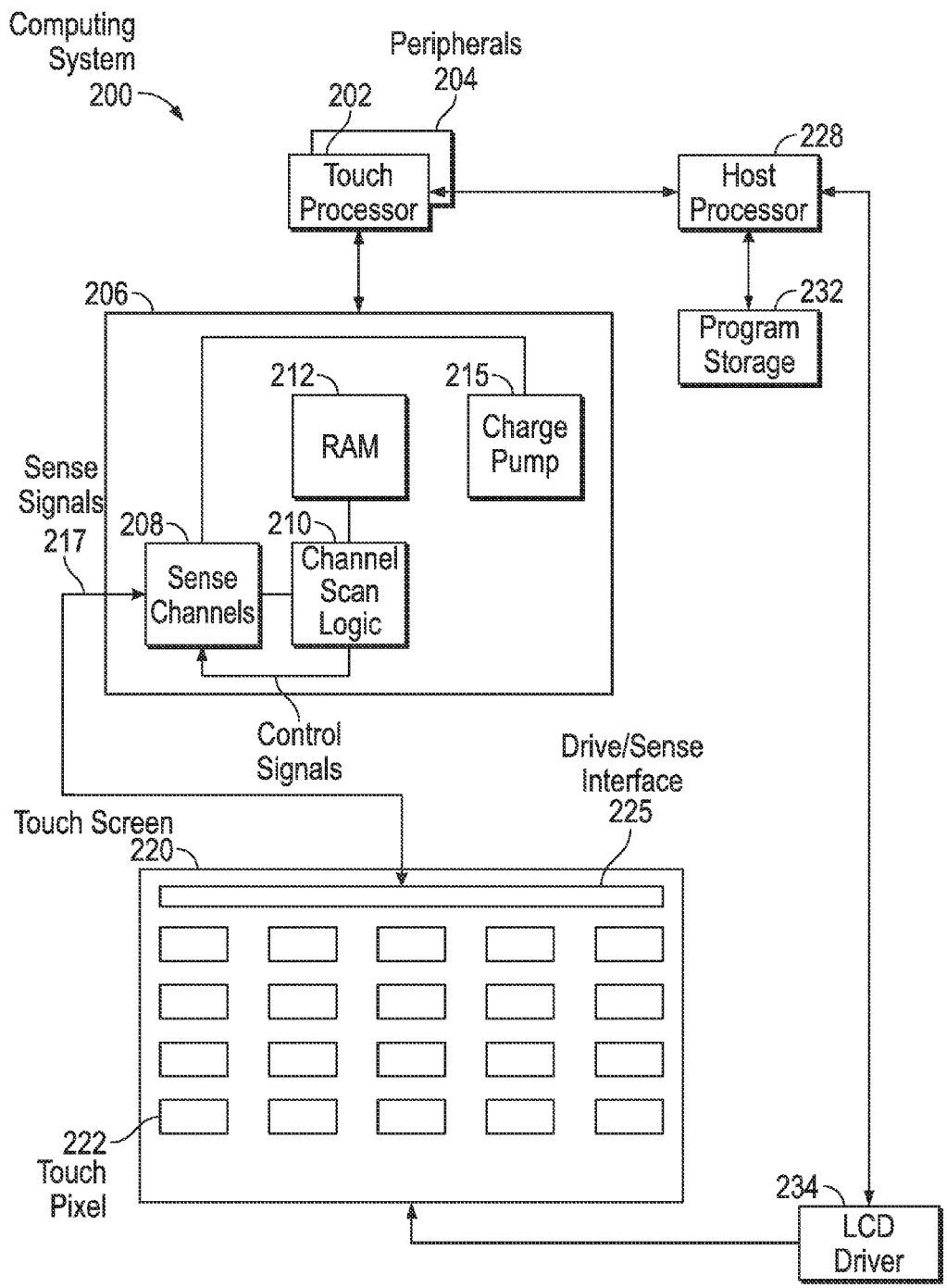
FIG. 2 is a block diagram of an example computing system that illustrates one implementation of an example touch screen according to examples of the disclosure.

FIG. 2 is a block diagram of an example computing system 200 that illustrates one implementation of an example touch screen 220 according to examples of the disclosure. Computing system 200 can be included in, for example, mobile telephone 136, digital media player 140, personal computer 144, tablet computer 148, or any mobile or non-mobile computing device that includes a touch screen, including a wearable device. Computing system 200 can include a touch sensing system including one or more touch processors 202, peripherals 204, a touch controller 206, and touch sensing circuitry (described in more detail below). Peripherals 204 can include, but are not limited to, random access memory (RAM) or other types of memory or storage, watchdog timers and the like. Touch controller 206 can include, but is not limited to, one or more sense channels 208 and channel scan logic 210. Channel scan logic 210 can access RAM 212, autonomously read data from sense channels 208 and provide control for the sense channels. In addition, channel scan logic 210 can control sense channels 208 to generate stimulation signals at various frequencies and phases that can be selectively applied to the touch pixels of touch screen 220, as described in more detail below. In some examples, touch controller 206, touch processor 202 and peripherals 204 can be integrated into a single application specific integrated circuit (ASIC), and in some examples can be integrated with touch screen 220 itself.

Touch screen 220 can be a self-capacitance touch screen, and can include touch sensing circuitry that can include a capacitive sensing medium having a plurality of touch pixels 222 (e.g., a pixelated self-capacitance touch screen). Touch pixels 222 can be coupled to sense channels 208 in touch controller 206, can be driven by stimulation signals from the sense channels through drive/sense interface 225, and can be sensed by the sense channels through the drive/sense interface as well, as described above. Labeling the conductive plates used to detect touch (i.e., touch pixels 222) as "touch pixels" can be particularly useful when touch screen 220 is viewed as capturing an "image" of touch. In other words, after touch controller 206 has determined an amount of touch detected at each touch pixel 222 in touch screen 220, the pattern of touch pixels in the touch screen at which a touch occurred can be thought of as an "image" of touch (e.g., a pattern of fingers touching the touch screen).

Computing system 200 can also include a host processor 228 for receiving outputs from touch processor 202 and performing actions based on the outputs. For example, host processor 228 can be connected to program storage 232 and a display controller, such as an LCD driver 234. The LCD driver 234 can provide voltages on select (gate) lines to each pixel transistor and can provide data signals along data lines to these same transistors to control the pixel display image as described in more detail below. Host processor 228 can use LCD driver 234 to generate an image on touch screen 220, such as an image of a user interface (UI), and can use touch processor 202 and touch controller 206 to detect a touch on or near touch screen 220. The touch input can be used by computer programs stored in program storage 232 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 228 can also perform additional functions that may not be related to touch processing.

Note that one or more of the functions described herein, including the configuration and operation of electrodes and sense channels, can be performed by firmware stored in memory (e.g., one of the peripherals 204 in FIG. 2) and executed by touch processor 202, or stored in program storage 232 and executed by host processor 228. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Figure 3A:
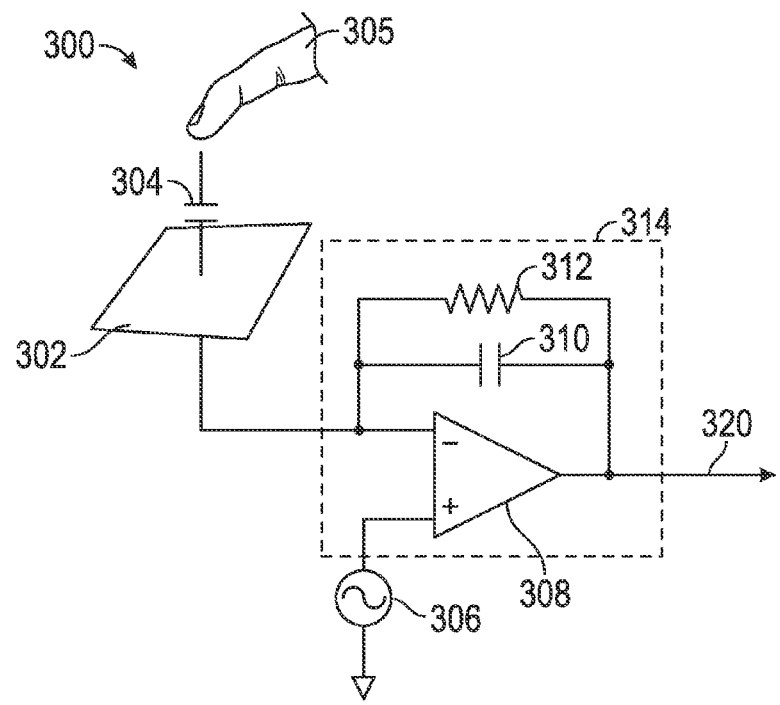
FIG. 3A illustrates an exemplary touch sensor circuit corresponding to a self-capacitance touch pixel electrode and sensing circuit according to examples of the disclosure.

FIG. 3A illustrates an exemplary touch sensor circuit 300 corresponding to a self-capacitance touch pixel electrode 302 and sensing circuit 314 according to examples of the disclosure. Touch pixel electrode 302 can correspond to touch pixel 222. Touch pixel electrode 302 can have an inherent self-capacitance to ground associated with it, and also an additional self-capacitance to ground that is formed when an object, such as finger 305, is in proximity to or touching the electrode. The total self-capacitance to ground of touch pixel electrode 302 can be illustrated as capacitance 304. Touch pixel electrode 302 can be coupled to sensing circuit 314 (which can correspond to sense channels 208). Sensing circuit 314 can include an operational amplifier 308, feedback resistor 312, feedback capacitor 310 and an input voltage source 306, although other configurations can be employed. For example, feedback resistor 312 can be replaced by a switched capacitor resistor in order to minimize any parasitic capacitance effect caused by a variable feedback resistor. Touch pixel electrode 302 can be coupled to the inverting input of operational amplifier 308. An AC voltage source 306 (Vac) can be coupled to the non-inverting input of operational amplifier 308. Touch sensor circuit 300 can be configured to sense changes in the total self-capacitance 304 of the touch pixel electrode 302 induced by a finger or object either touching or in proximity to the touch sensor panel. Output 320 can be used by a processor (e.g., touch controller 206) to determine the presence of a proximity or touch event, or the output can be inputted into a discrete logic network to determine the presence of a touch or proximity event. Touch sensor circuit 300 can represent the structure and/or operation of touch pixel sensing of the examples of the disclosure.

Figure 3B:
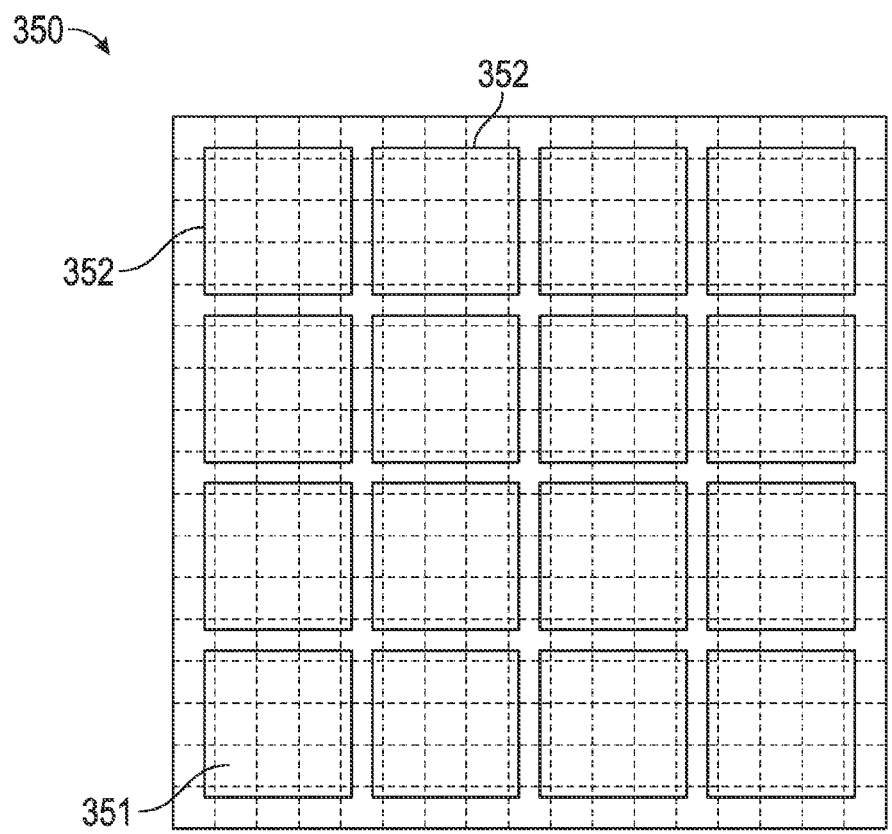
FIG. 3B illustrates an example configuration in which common electrodes can form portions of the touch sensing circuitry of a touch sensing system.

In some examples, touch screen 220 can be an integrated touch screen in which touch sensing circuit elements of the touch sensing system can be integrated into the display pixel stackups of a display. The circuit elements in touch screen 220 can include, for example, elements that can exist in LCD or other displays (e.g., OLED displays), such as one or more pixel transistors (e.g., thin film transistors (TFTs)), gate lines, data lines, pixel electrodes and common electrodes. In any given display pixel, a voltage between a pixel electrode and a common electrode can control a luminance of the display pixel. The voltage on the pixel electrode can be supplied by a data line through a pixel transistor, which can be controlled by a gate line. It is noted that circuit elements are not limited to whole circuit components, such as a whole capacitor, a whole transistor, etc., but can include portions of circuitry, such as only one of the two plates of a parallel plate capacitor. FIG. 3B illustrates an example configuration in which common electrodes 352 can form portions of the touch sensing circuitry of a touch sensing system—in some examples of this disclosure, the common electrodes can form touch pixels used to detect an image of touch on touch screen 350, as described above. Each common electrode 352 (i.e., touch pixel) can include a plurality of display pixels 351, and each display pixel 351 can include a portion of a common electrode 352, which can be a circuit element of the display system circuitry in the display pixel stackup (i.e., the stacked material layers forming the display pixels) of the display pixels of some types of LCD or other displays that can operate as part of the display system to display an image.

In the example shown in FIG. 3B, each common electrode 352 can serve as a multi-function circuit element that can operate as display circuitry of the display system of touch screen 350 and can also operate as touch sensing circuitry of the touch sensing system. In this example, each common electrode 352 can operate as a common electrode of the display circuitry of the touch screen 350, as described above, and can also operate as touch sensing circuitry of the touch screen. For example, a common electrode 352 can operate as a capacitive part of a touch pixel of the touch sensing circuitry during the touch sensing phase. Other circuit elements of touch screen 350 can form part of the touch sensing circuitry by, for example, switching electrical connections, etc. More specifically, in some examples, during the touch sensing phase, a gate line can be connected to a power supply, such as a charge pump, that can apply a voltage to maintain TFTs in display pixels included in a touch pixel in an "off" state. Stimulation signals can be applied to common electrode 352. Changes in the total self-capacitance of common electrode 352 can be sensed through an operational amplifier, as previously discussed. The change in the total self-capacitance of common electrode 352 can depend on the proximity of a touch object, such as a finger, to the common electrode. In this way, the measured change in total self-capacitance of common electrode 352 can provide an indication of touch on or near the touch screen.

In general, each of the touch sensing circuit elements may be either a multi-function circuit element that can form part of the touch sensing circuitry and can perform one or more other functions, such as forming part of the display circuitry, or may be a single-function circuit element that can operate as touch sensing circuitry only. Similarly, each of the display circuit elements may be either a multi-function circuit element that can operate as display circuitry and perform one or more other functions, such as operating as touch sensing circuitry, or may be a single-function circuit element that can operate as display circuitry only. Therefore, in some examples, some of the circuit elements in the display pixel stackups can be multi-function circuit elements and other circuit elements may be single-function circuit elements. In other examples, all of the circuit elements of the display pixel stackups may be single-function circuit elements.

In addition, although examples herein may describe the display circuitry as operating during a display phase, and describe the touch sensing circuitry as operating during a touch sensing phase, it should be understood that a display phase and a touch sensing phase may be operated at the same time, e.g., partially or completely overlap, or the display phase and touch sensing phase may operate at different times. Also, although examples herein describe certain circuit elements as being multi-function and other circuit elements as being single-function, it should be understood that the circuit elements are not limited to the particular functionality in other examples. In other words, a circuit element that is described in one example herein as a single-function circuit element may be configured as a multi-function circuit element in other examples, and vice versa.

The common electrodes 352 (i.e., touch pixels) and display pixels 351 of FIG. 3B are shown as rectangular or square regions on touch screen 350. However, it is understood that the common electrodes 352 and display pixels 351 are not limited to the shapes, orientations, and positions shown, but can include any suitable configurations according to examples of the disclosure.

While the discussion in this disclosure focuses on touch screens, it is understood that some or all of the examples of the disclosure can similarly be implemented in a touch sensor panel (i.e., a panel having touch sensing circuitry without display circuitry). For brevity, however, the examples of the disclosure have been, and will be, described in the context of a touch screen.

Because the touch screen of the disclosure can be included in various devices, such as those illustrated in FIGS. 1A-1D, it can be the case that the ground node in the touch screen electronics (i.e., the "system ground") may not be the same as earth ground. This system ground-earth ground mismatch can cause undesirable effects when a user, who may be grounded to earth ground, interacts with the touch screen.

Figure 4:
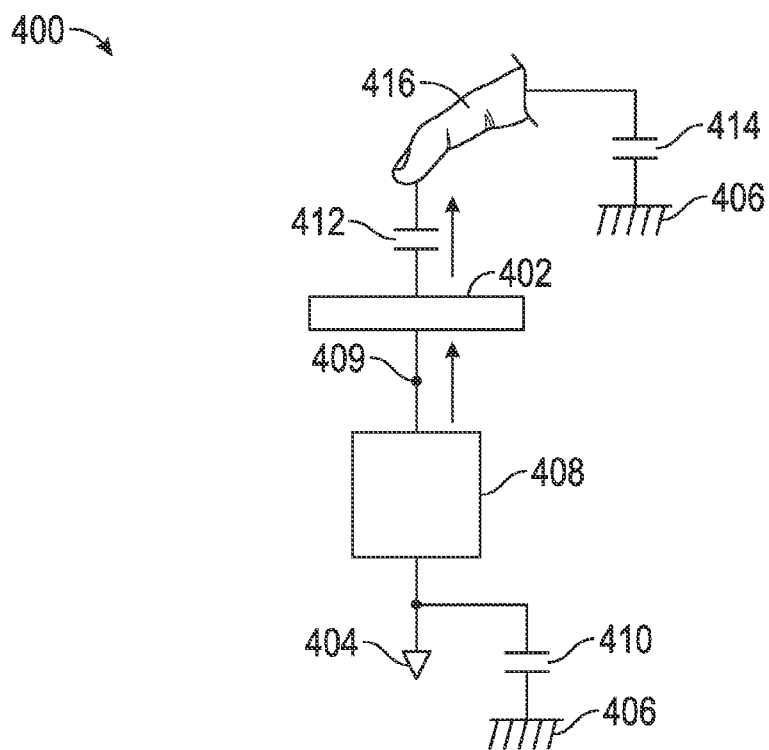
FIG. 4 illustrates an exemplary circuit that can represent exemplary operation of a self-capacitance touch screen according to examples of the disclosure.

FIG. 4 illustrates an exemplary circuit 400 that can represent exemplary operation of a self-capacitance touch screen according to examples of the disclosure. Touch pixel 402 can be coupled to touch circuitry 408, which can correspond to sense channels 208, for example. Touch circuitry 408 can be coupled to system ground 404. In some examples, touch circuitry 408 can include an operational amplifier, a non-inverting input of which can be coupled to a stimulation source, and an inverting input of which can be coupled to touch pixel 402. Touch circuitry 408 can stimulate and sense touch pixel 402 to sense an object (such as finger 416) touching or in proximity to the touch pixel, as described above.

As stated above, touch circuitry 408 can drive and sense touch pixel 402 to sense touch or proximity of finger 416. Sensing of this touch or proximity can be accomplished by sensing changes in capacitance 412 between touch pixel 402 and finger 416, which can change based on the distance of the finger from the touch pixel. Finger 416 can be grounded through capacitance 414 to earth ground 406. It is understood that although the examples of this disclosure describe a finger interacting with the touch screen, the scope of the disclosure extends to any interaction with the touch screen, including with an object such as a stylus. Operation of the touch screen in such circumstances can be similar to the operation described here.

Because touch pixel 402 can be part of a touch screen that can be included in a device that may not be grounded to earth ground (such as the devices in FIGS. 1A-1D), system ground 404 can be different from earth ground 406. As a result, capacitance 410 can exist between system ground 404 and earth ground 406 to reflect this difference. In other words, system ground 404 can be at least somewhat floating with respect to earth ground 406. In some examples, system ground 404 can be at a higher voltage than earth ground 406, and in some examples, the system ground can be at a lower voltage than earth ground—in some examples, the system ground can fluctuate between being at a higher voltage than earth ground and being at a lower voltage than earth ground.

Due to system ground 404 being somewhat floating with respect to earth ground 406, for a given voltage being applied to node 409 by sense circuitry 408, the amount of current being driven through capacitance 412 can vary as a function of the magnitude of capacitance 410. In particular, when capacitance 410 is relatively large (e.g., when a user is grounded or shorted to system ground 404, such as when the user is touching the chassis in which the touch screen resides), the current being driven through capacitance 412 can be relatively large, and thus sensing changes in capacitance 412 can be relatively easy. On the other hand, when capacitance 410 is relatively small (e.g., when the user is "ungrounded"—that is, when the user is not touching the chassis), the current being driven through capacitance 412 can be relatively small, because the current may need to be driven through the series capacitances 414 and 410 in addition to capacitance 412; this can reduce the current being driven through capacitance 412. This reduction in current can, in turn, make sensing changes in capacitance 412 relatively difficult. Thus, how well-grounded the touch screen is can affect how much current is being driven through capacitance 412 (the capacitance of interest), and therefore the touch sensing performance of the touch screen.

A further consequence of system ground 404 being somewhat floating with respect to earth ground 406 can be that the system ground can fluctuate as touch circuitry 408 drives current though capacitance 412, finger 416 and capacitance 414 to earth ground 406. As a result, the voltage at node 409 can also fluctuate, which can cause fluctuations in the current being driven through capacitance 412 (the capacitance of interest when determining an amount of touch present at touch pixel 402). These fluctuations of current flowing through capacitance 412 can then be sensed by touch circuitry 408, and can be erroneously interpreted as fluctuations in current due to changes in capacitance 412, which can result in inaccurate touch sensing results. In other words, fluctuations in current flowing through capacitance 412, whether due to changes in capacitance 412 or due to changes in system ground 404, can all be interpreted as touch-related fluctuations, when this may not be the case. This can result in errors in the touch sensing performance of the touch screen.

Figure 5:
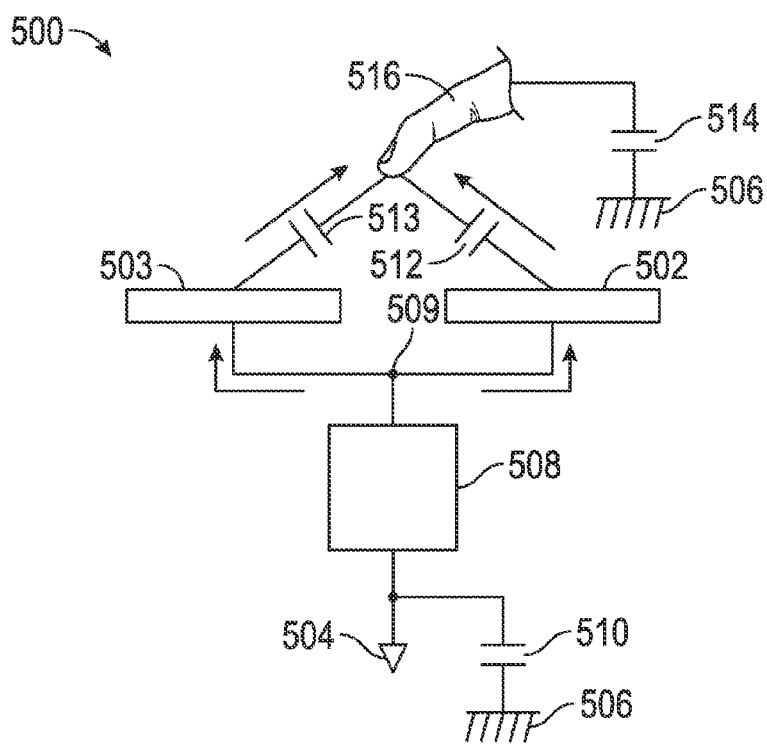
FIG. 5 illustrates an exemplary circuit that can represent exemplary operation of a self-capacitance touch screen when multiple touch pixels are being driven and sensed according to examples of the disclosure.

FIG. 5 illustrates an exemplary circuit 500 that can represent exemplary operation of a self-capacitance touch screen when multiple touch pixels are being driven and sensed according to examples of the disclosure. The change in current that is being driven through the capacitance of interest described above with reference to FIG. 4 (e.g., capacitance 412) can be exacerbated when multiple touch pixels on the touch screen are being driven at the same time. The configuration of FIG. 5 can be substantially that of FIG. 4, except that touch circuitry 508 can be driving both touch pixels 502 and 503. Capacitance 512 can exist between touch pixel 502 and finger 516, and capacitance 513 can exist between touch pixel 503 and the finger. Because parallel paths for current flow from node 509 to finger 516 can exist through capacitances 512 and 513, less current can be driven through any one particular capacitance of interest as compared with the current being driven through capacitance 412 in FIG. 4, thus potentially making it more difficult to sense changes in that capacitance resulting from touch or proximity activity. For example, if capacitance 512 is the capacitance of interest (e.g., touch circuitry 508 is to sense an amount of touch at touch pixel 502), current that could otherwise be driven through capacitance 512 can instead be driven through capacitance 513, thus reducing the current that is being driven through capacitance 512, which can make sensing changes in capacitance 512 more difficult than it might otherwise be. Therefore, reductions in the current being driven through the capacitance of interest that result from changes in how well-grounded the touch screen is can be even more pronounced than in the configuration of FIG.

4. This can make it even more difficult for sense circuitry 508 to sense changes in that capacitance of interest.

One way to increase the current being driven through the capacitance of interest, and thus reduce errors in touch sensing that may result from changes in the grounding-condition of the touch screen, can be to drive and sense a single touch pixel on the touch screen at a time, while, in some examples, grounding the remaining touch pixels.

Figure 6:
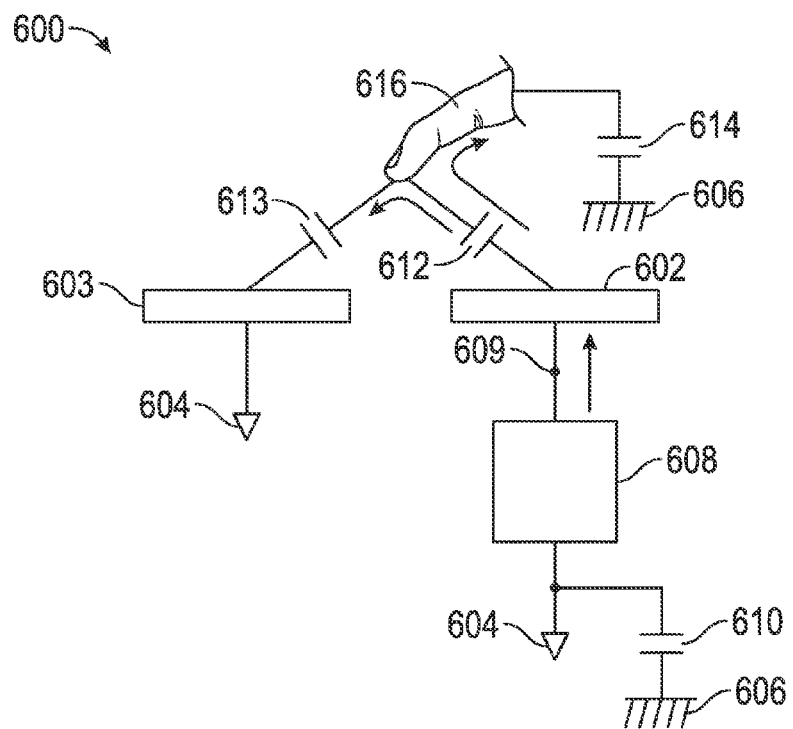
FIG. 6 illustrates an exemplary circuit that can represent exemplary operation of a self-capacitance touch screen when one touch pixel is being driven and sensed according to examples of the disclosure.

FIG. 6 illustrates an exemplary circuit 600 that can represent exemplary operation of a self-capacitance touch screen when one touch pixel is being driven and sensed according to examples of the disclosure. The configuration of FIG. 6 can be substantially that of FIG. 5, except that touch circuitry 608 can be driving and sensing touch pixel 602 only. Touch pixel 603 can be coupled to system ground 604. In some examples, touch pixel 603 can be coupled to system ground 604 by switching the non-inverting input of an operational amplifier, the inverting input of which can be coupled to touch pixel 603, to the system ground; in some examples, touch pixel 603 can be directly coupled to system ground via a switch network; in some examples, any appropriate configuration for coupling touch pixel 603 to system ground 604 can be utilized.

When touch circuitry 608 is driving touch pixel 602, current can be driven though capacitance 612 to earth ground 606 via capacitance 614, as well as through capacitance 612 to system ground 604 via capacitance 613. This dual current pathway can increase the current being driven through capacitance 612, and can thus make it easier for touch circuitry 608 to sense changes in capacitance 612 (e.g., a unit change in capacitance 612 can cause greater changes in voltage across the capacitance when greater current is flowing through the capacitance, which can increase the signal-to-noise ratio of the touch sensing system and can make touch activity easier to sense). In some examples, instead of being coupled to system ground 604, touch pixel 603 (and other non-driven touch pixels on the touch screen) can be coupled to a voltage lower than system ground (e.g., 1V below system ground) to increase the current flowing through capacitance 613, and thus further increase the current flowing through capacitance 612. In some examples, touch pixel 603 (and other non-driven touch pixels on the touch screen) can be coupled to any other suitable reference voltage (e.g., system ground 604, 1V below system ground, an AC voltage such as a voltage that is out of phase with the voltage driving touch pixel 602, etc.) to achieve a similar effect.

Though, as before, the current being driven through capacitance 612 in the configuration of FIG. 6 may continue to change as a function of how well-grounded the touch screen is, those changes can result in voltage modulations across capacitance 612 that are a smaller percentage of the total voltage modulation sensed by touch circuitry 608 than before (e.g., than in the configuration of FIGS. 4 and 5). Thus, such changes in current can be less problematic that in the examples described previously.

In some examples, it can be desirable to drive and sense more than a single touch pixel on the touch screen at a time to reduce the amount of time needed to sense touch across the entire touch screen, while still substantially benefiting from the effects described above with reference to FIG. 6.

Figure 7:
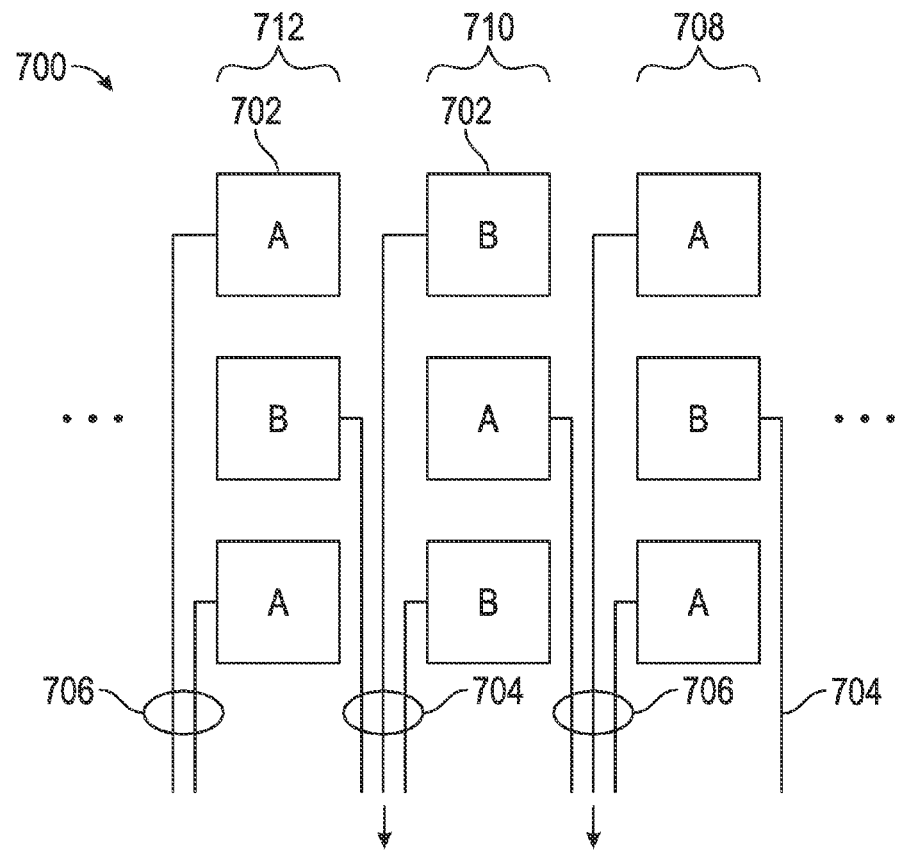
FIG. 7 illustrates an exemplary touch pixel driving and routing scheme according to examples of the disclosure.

FIG. 7 illustrates an exemplary touch pixel driving and routing scheme according to examples of the disclosure. Touch screen 700 can include touch pixels 702. Touch pixels 702 can be driven and sensed in an alternately arranged checkerboard pattern, as illustrated, where the "A" touch pixels can be driven and sensed while the "B" touch pixels can be tied to system ground (or other reference voltage) during a first sensing time period, and the "B" touch pixels can be driven and sensed while the "A" touch pixels can be tied to system ground (or other reference voltage) during a second sensing time period. In this way, the circuit representation of any two adjacent touch pixels 702 can look substantially like the one illustrated in FIG. 6, and the associated touch pixel-to-finger increased current effect can be substantially realized across touch screen 700.

Additionally, because orthogonally adjacent touch pixels 702 are not simultaneously driven in the driving and sensing scheme of FIG. 7, the effects illustrated and described with respect to FIG. 5 in which simultaneously driven touch pixels are simultaneously in proximity to a finger can be substantially avoided. Although diagonally adjacent touch pixels 702 are simultaneously driven in the driving scheme of FIG. 7, the effects described with respect to FIG. 5 can be less pronounced as between diagonal touch pixels as compared to orthogonally adjacent touch pixels; this can be the case because diagonal touch pixels can have less adjacent area as compared with orthogonally adjacent touch pixels, and thus can have less overlap with a finger that may be in proximity to the diagonal touch pixels at the same time.

In addition to the driving and sensing scheme described above, the routing used to couple touch circuitry (e.g., touch circuitry 408, 508, and/or 608) to touch pixels 702 can be configured as illustrated in FIG. 7 to reduce or eliminate parasitic capacitances that may exist between touch pixel routing lines (and thus the parasitic capacitances that may exist between touch pixels). Specifically, the routing for pixels that are to be driven and sensed together can be grouped and routed together, which can reduce or eliminate any capacitances that may exist between the grouped routing lines, as every line in the group can be driven with substantially the same voltage at substantially the same frequency and phase.

Referring to FIG. 7, routing for "A" touch pixels 702 included in touch pixel columns 708 and 710 can be grouped and routed between columns 708 and 710, as illustrated by routing 706. Routing for "B" touch pixels 702 included in touch pixel columns 710 and 712 can be grouped and routed between columns 710 and 712, as illustrated by routing 704. This alternately arranged pattern of routing can be repeated across touch screen 700. Using such a routing configuration can result in groupings of routing lines to which only "A" or "B" touch pixels 702 are coupled. In turn, routing-to-routing parasitic capacitances can be reduced or eliminated.

It is understood that while the routing groupings illustrated in FIG. 7 are groupings defined by columns of touch pixels, this need not be the case, and the routing groupings can instead be defined by rows of touch pixels (e.g., the routing lines can be grouped and routed horizontally in a manner analogous to that described above), or any other configuration in which similar routing lines (e.g., routing lines coupled to the same type of touch pixel) are grouped and routed together on a touch screen.

It should be noted that the physical routing scheme illustrated in FIG. 7 does not limit the driving and sensing scheme that can be utilized on touch screen 700—the physical routing scheme can be utilized with a driving and sensing scheme other than the one illustrated in FIG. 7. In such a scenario, some or all of the reduction in routing-to-routing parasitic capacitance discussed above may be lost, however. Nonetheless, the physical routing scheme illustrated in FIG. 7 can be utilized in any of the examples of the disclosure, including the examples illustrated in FIGS. 8A-8B, discussed below.

As described above, it can be beneficial to avoid simultaneously-driven touch pixels being located in proximity to a finger at the same time. Thus, it can be beneficial to minimize the number of touch pixels that are being driven and sensed simultaneously on a touch screen. However, driving fewer touch pixels simultaneously can increase the time it takes to capture a full image of touch across the entire touch screen. Thus, in some examples, a touch pixel driving scheme can aim to maximize the number of simultaneously-driven touch pixels (to reduce touch sensing time) while maintaining or maximizing the likelihood that two simultaneously-driven touch pixels will not both be in proximity to a finger at the same time.

Figure 8A:
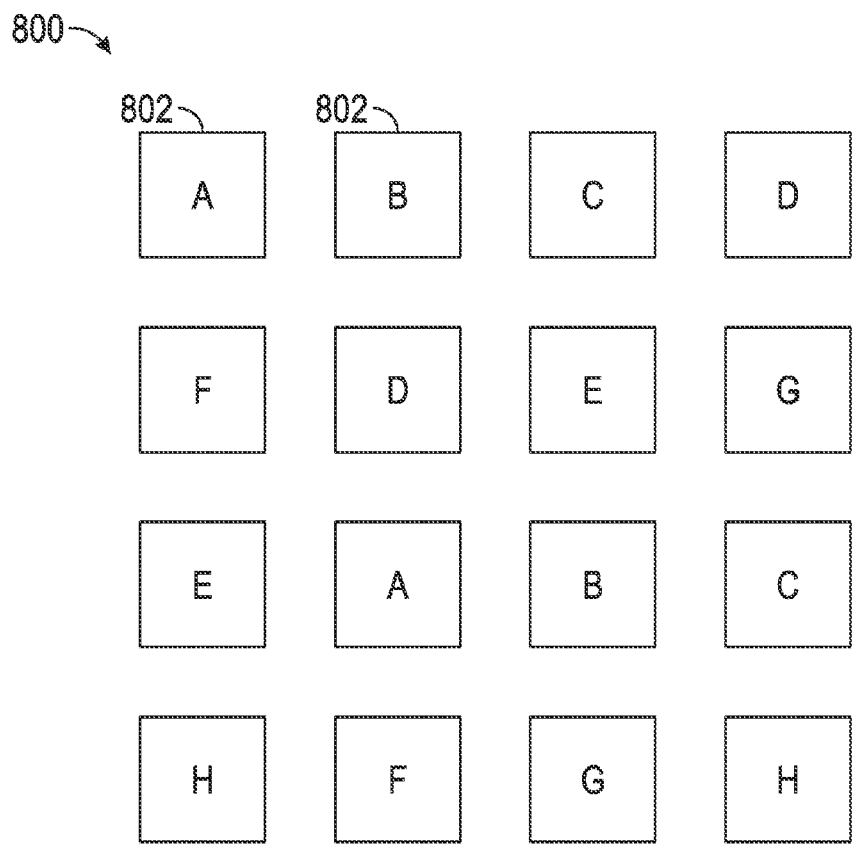
FIG. 8A illustrates an exemplary touch pixel driving scheme according to examples of the disclosure.

FIG. 8A illustrates an exemplary touch pixel driving scheme according to examples of the disclosure. Touch screen 800 can include touch pixels 802. Touch pixels 802 can be driven and sensed such that two touch pixels can be simultaneously driven at any point in time, while maximizing the distance between simultaneously-driven touch pixels (to increase the likelihood that the simultaneously-driven touch pixels will not simultaneously be in proximity to a finger), and substantially keeping constant the distance between simultaneously-driven touch pixels from group to group to keep parasitic effects (such as capacitances) relatively constant from scan to scan. For example, during a first sensing time period, "A" touch pixels can be simultaneously driven and sensed while the remaining touch pixels (e.g., the non-driven touch pixels) can be tied to system ground (or other reference voltage); during a second sensing time period, "B" touch pixels can be simultaneously driven and sensed while the remaining touch pixels (e.g., the non-driven touch pixels) can be grounded to system ground (or other reference voltage); etc. In the illustrated driving and sensing scheme, the distances between "A", "B", "C", "D", "E", "F" and "G" touch pixels 802 can be substantially constant (the distance between the "H" touch pixels can be slightly less due to the touch pixel layout illustrated). Further, the distances between "A", "B", "C", "D", "E", "F", "G" and "H" touch pixels can be sufficiently large so as to substantially minimize the likelihood that any two touch pixels of the same type will be in proximity to the same finger at the same time.

Other driving and sensing schemes based on the above principles are similarly within the scope of this disclosure. For example, depending on the size and configuration of touch screen 800 and touch pixels 802 relative to the size (or size range) of an average finger, more than two touch pixels (e.g., three, four, five, etc.) can be simultaneously driven and sensed while maintaining a sufficiently low likelihood that a single finger will be in proximity to more than one touch pixel of the same type at the same time. Similarly, the distances between touch pixels of the same type can additionally or alternatively depend on the size and configuration of touch screen 800 and touch pixels 802 relative to the size (or size range) of an average finger. Further, the length of time of that touch pixels of the same type can be driven and sensed can be based on the above finger size and touch sensor panel size/configuration (e.g., in some examples, the more touch pixels that are simultaneously being driven and sensed, the longer the touch pixels can be driven and sensed, because there can be less need to drive and sense quickly to be able to scan the entire touch panel within a specified amount of time).

Figure 8B:
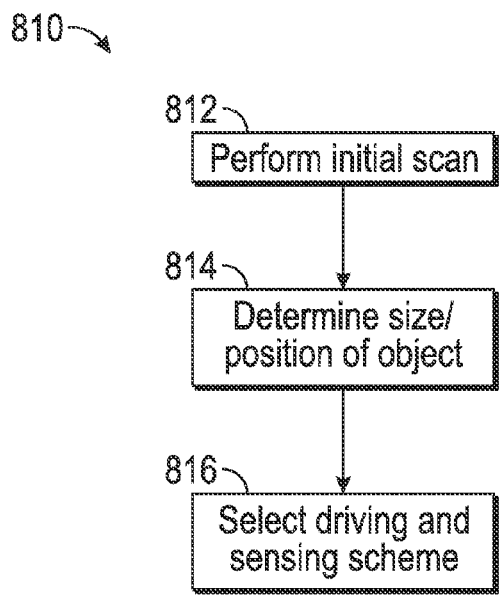
FIG. 8B illustrates an exemplary dynamic touch pixel driving scheme according to examples of the disclosure.

In some examples, the precise driving and sensing scheme used by touch screen 800 can be dynamically determined and/or adjusted based on the size(s) of a finger(s) interacting with the touch screen (e.g., larger fingers can result in fewer touch pixels being driven and sensed simultaneously and/or touch pixels of the same type being further apart, whereas smaller fingers can result in more touch pixels being driven and sensed simultaneously and/or touch pixels of the same type being closer together). FIG. 8B illustrates an exemplary dynamic touch pixel driving scheme 810 according to examples of the disclosure. In such examples, touch screen 800 can be initially scanned at 812 in any appropriate manner to determine (or approximately determine) the size(s) of a finger(s) interacting with the touch screen. For example, a touch controller (e.g., touch controller 206 having channel scan logic 210) and/or touch processor (e.g., touch processor 202) coupled to touch screen 800 can scan all touch pixels 802 simultaneously during an initial scan time period to capture a touch image on the touch screen. In some examples, the touch controller and/or touch processor can scan fewer than all touch pixels 802 simultaneously (e.g., scan every other touch pixel, or scan collections of touch pixels together as a single effective "touch pixel") during the initial scan time period to capture an approximate or coarse touch image on touch screen 800. Performing a coarse scan of touch screen 800 can save time needed to perform the initial scan.

At 814, the touch controller and/or touch processor can determine sizes and/or positions of objects or fingers interacting with the touch screen based on a touch image obtained during the initial scan time period.

At 816, the touch controller and/or touch processor can select a driving and sensing scheme (including determining touch pixel groupings, distances, sensing time periods, etc.) in which two or more touch pixels of the same type will likely not simultaneously be in proximity to the same finger of the size(s) detected, based on the determined size(s) and/or location(s) of the object(s) or finger(s) interacting with the touch screen. In some examples, the touch controller can also attempt to maximize the number of simultaneously driven touch pixels to reduce touch sensing time.

As described above, in some examples, the driving and sensing schemes described with reference to FIGS. 8A-8B can be utilized with the routing scheme described with respect to FIG. 7, despite the fact that all of the benefits of the routing scheme of FIG. 7 may not be realized with the driving and sensing schemes of FIG. 8A-8B.

Thus, the examples of the disclosure provide one or more configurations for countering effects of a floating system ground node in a touch screen system.

Therefore, according to the above, some examples of the disclosure are directed to a touch controller comprising sense circuitry configured to be coupled to a first touch pixel and a second touch pixel on a touch sensor panel. In some examples, the sense circuitry is configured to: drive and sense the first touch pixel and couple the second touch pixel to a reference voltage during a first time period. In some examples, during a second time period, the sense circuitry is configured to drive and sense the second touch pixel and couple the first touch pixel to the reference voltage. Additionally or alternatively to one or more of the examples disclosed above, in some examples, the reference voltage comprises a system ground of the touch controller. Additionally or alternatively to one or more of the examples disclosed above, in some examples, the sense circuitry is configured to be coupled to a first plurality of touch pixels and a second plurality of touch pixels. In some examples, the first plurality of touch pixels includes the first touch pixel and the second plurality of touch pixels includes the second touch pixel. In some examples, the sense circuitry is configured to drive and sense the first plurality of touch pixels and couple the second plurality of touch pixels to the reference voltage during the first time period. In some examples, during the second time period, the sense circuitry is configured to drive and sense the second plurality of touch pixels and couple the first plurality of touch pixels to the reference voltage. Additionally or alternatively to one or more of the examples disclosed above, in some examples, the first plurality of touch pixels and the second plurality of touch pixels are alternately arranged in a checkerboard pattern on the touch sensor panel. Additionally or alternatively to one or more of the examples disclosed above, in some examples, the sense circuitry is configured to be coupled to the first plurality of touch pixels using a first set of routing on the touch sensor panel. In some examples, the sense circuitry is configured to be coupled to the second plurality of touch pixels using a second set of routing on the touch sensor panel, and the first set of routing and the second set of routing are alternately disposed between columns of touch pixels on the touch sensor panel. Additionally or alternatively to one or more of the examples disclosed above, in some examples, one or more distances between touch pixels in the first plurality of touch pixels are substantially the same as one or more distances between touch pixels in the second plurality of touch pixels. Additionally or alternatively to one or more of the examples disclosed above, in some examples, the sense circuitry is configured to drive and sense multiple other pluralities of touch pixels on the touch sensor panel during other respective time periods, the multiple other pluralities of touch pixels being different than the first and second pluralities of touch pixels, and the other respective time periods being different than the first and second time periods. Additionally or alternatively to one or more of the examples disclosed above, in some examples, the touch controller further comprises logic configured to dynamically determine the first touch pixel and the second touch pixel to be driven and sensed by the sense circuitry. Additionally or alternatively to one or more of the examples disclosed above, in some examples, the logic is configured to determine a size of an object interacting with the touch sensor panel and determine the first touch pixel and the second touch pixel based on the determined size of the object. Additionally or alternatively to one or more of the examples disclosed above, in some examples, the logic is configured to determine a location of an object interacting with the touch sensor panel and determine the first touch pixel and the second touch pixel based on the determined location of the object. Additionally or alternatively to one or more of the examples disclosed above, in some examples, the logic is configured to initiate an initial scan of the touch sensor panel in which the first touch pixel and the second touch pixel are driven and sensed simultaneously prior to determining the size of the object and determine the size of the object based on the initial scan. Additionally or alternatively to one or more of the examples disclosed above, in some examples, the logic is configured to initiate an initial scan of the touch sensor panel in which the first touch pixel and the second touch pixel are driven and sensed simultaneously prior to determining the location of the object and determine the location of the object based on the initial scan.

Some examples of the disclosure are directed to a method of operating a touch sensor panel. The method comprises driving and sensing a first touch pixel on the touch sensor panel and coupling a second touch pixel on the touch sensor panel to a reference voltage during a first time period. In some examples, the method further comprises driving and sensing the second touch pixel and coupling the first touch pixel to the reference voltage during a second time period. Additionally or alternatively to one or more of the examples disclosed above, in some examples, coupling the first touch pixel and the second touch pixel, respectively, to the reference voltage comprises coupling the first touch pixel and the second touch pixel, respectively, to a system ground of the touch sensor panel. Additionally or alternatively to one or more of the examples disclosed above, in some examples, a first plurality of touch pixels includes the first touch pixel and a second plurality of touch pixels includes the second touch pixel. Additionally or alternatively to one or more of the examples disclosed above, in some examples, the method further comprises driving and sensing the first plurality of touch pixels and coupling the second plurality of touch pixels to the reference voltage during the first time period. In some examples, the method further comprises driving and sensing the second plurality of touch pixels, and coupling the first plurality of touch pixels to the reference voltage during the second time period. Additionally or alternatively to one or more of the examples disclosed above, in some examples, first plurality of touch pixels and the second plurality of touch pixels are alternately arranged in a checkerboard pattern on the touch sensor panel. Additionally or alternatively to one or more of the examples disclosed above, in some examples, the method further comprises coupling the first plurality of touch pixels to sense circuitry using a first set of routing on the touch sensor panel and coupling the second plurality of touch pixels to the sense circuitry using a second set of routing on the touch sensor panel, wherein the first set of routing and the second set of routing are alternately disposed between columns of touch pixels on the touch sensor panel. Additionally or alternatively to one or more of the examples disclosed above, in some examples, one or more distances between touch pixels in the first plurality of touch pixels are substantially the same as one or more distances between touch pixels in the second plurality of touch pixels. Additionally or alternatively to one or more of the examples disclosed above, in some examples, the method further comprises driving and sensing multiple other pluralities of touch pixels on the touch sensor panel during other respective time periods. In some examples, the multiple other pluralities of touch pixels are different than the first and second pluralities of touch pixels. In some examples, the other respective time periods are different than the first and second time periods. Additionally or alternatively to one or more of the examples disclosed above, in some examples, the method further comprises dynamically determining the first touch pixel and the second touch pixel to be driven and sensed. Additionally or alternatively to one or more of the examples disclosed above, in some examples, dynamically determining the first touch pixel and the second touch pixel comprises determining a size of an object interacting with the touch sensor panel and determining the first touch pixel and the second touch pixel based on the determined size of the object. Additionally or alternatively to one or more of the examples disclosed above, in some examples, dynamically determining the first touch pixel and the second touch pixel comprises determining a location of an object interacting with the touch sensor panel; and determining the first touch pixel and the second touch pixel based on the determined location of the object. Additionally or alternatively to one or more of the examples disclosed above, in some examples, the method further comprises initiating an initial scan of the touch sensor panel in which the first touch pixel and the second touch pixel are driven and sensed simultaneously prior to determining the size of the object and determining the size of the object based on the initial scan. Additionally or alternatively to one or more of the examples disclosed above, in some examples, the method further comprises initiating an initial scan of the touch sensor panel in which the first touch pixel and the second touch pixel are driven and sensed simultaneously prior to determining the location of the object and determining the location of the object based on the initial scan.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed is:

1. A touch controller comprising:
sense circuitry configured to be coupled to a plurality of touch pixel electrodes arranged in rows on a touch sensor panel, each touch pixel electrode of the plurality of touch pixel electrodes corresponding to a unique horizontal and a unique vertical position on the touch sensor panel, the sense circuitry configured to:
during a first time period, drive and sense self-capacitances of a first plurality of touch pixel electrodes of the plurality of touch pixel electrodes using a first voltage signal while concurrently driving a second plurality of touch pixel electrodes of the plurality of touch pixel electrodes at a reference voltage, different from the first voltage signal; and
during a second time period, drive and sense self-capacitances of the second plurality of touch pixel electrodes using a second voltage signal while concurrently driving the first plurality of touch pixel electrodes at the reference voltage, different from the second voltage signal, wherein each row of the rows of touch pixel electrodes on the touch sensor panel includes touch pixel electrodes from the first plurality of touch pixel electrodes and touch pixel electrodes from the second plurality of touch pixel electrodes alternately arranged along the row.

2. The touch controller of claim 1, wherein the reference voltage comprises a system ground of the touch controller.

3. The touch controller of claim 1, wherein:
the plurality of touch pixel electrodes on the touch sensor panel are arranged in the rows and in columns on the touch sensor panel, and
the first plurality of touch pixel electrodes and the second plurality of touch pixel electrodes are arranged in a checkerboard pattern alternating in two dimensions on the touch sensor panel such that:
each row of the rows of touch pixel electrodes on the touch sensor panel includes touch pixel electrodes from the first plurality of touch pixel electrodes and touch pixel electrodes from the second plurality of touch pixel electrodes alternately arranged along the row, and
each column of the columns of touch pixel electrodes on the touch sensor panel includes touch pixel electrodes from the first plurality of touch pixel electrodes and touch pixel electrodes from the second plurality of touch pixel electrodes alternately arranged along the column.

4. The touch controller of claim 3, wherein:
the sense circuitry is configured to be coupled to the first plurality of touch pixel electrodes using a first set of routing on the touch sensor panel,
the sense circuitry is configured to be coupled to the second plurality of touch pixel electrodes using a second set of routing on the touch sensor panel, and
the first set of routing and the second set of routing are alternately disposed between the columns of touch pixel electrodes on the touch sensor panel such that the first set of routing and the second set of routing are not both disposed between any two adjacent columns of the columns of touch pixel electrodes on the touch sensor panel.

5. The touch controller of claim 1, wherein one or more distances between touch pixel electrodes in the first plurality of touch pixel electrodes are substantially the same as one or more distances between touch pixel electrodes in the second plurality of touch pixel electrodes.

6. The touch controller of claim 1, wherein the sense circuitry is configured to drive and sense multiple other pluralities of touch pixel electrodes on the touch sensor panel during other respective time periods, the multiple other pluralities of touch pixels being different than the first and second pluralities of touch pixel electrodes, and the other respective time periods being different than the first and second time periods.

7. The touch controller of claim 1, further comprising:
logic configured to dynamically determine which of the plurality of touch pixel electrodes is the first plurality of touch pixel electrodes and which of the plurality of touch pixel electrodes is the second plurality of touch pixel electrodes to be driven and have their self-capacitances sensed by the sense circuitry.

8. The touch controller of claim 7, wherein the logic is configured to:
determine a size of an object interacting with the touch sensor panel; and
determine which of the plurality of touch pixel electrodes is the first plurality of touch pixel electrodes and which of the plurality of touch pixel electrodes is the second plurality of touch pixel electrodes based on the determined size of the object.

9. The touch controller of claim 8, wherein the logic is configured to:
prior to determining the size of the object, initiate an initial scan of the touch sensor panel in which the first plurality of touch pixel electrodes and the second plurality of touch pixel electrodes are driven and sensed simultaneously; and
determine the size of the object based on the initial scan.

10. The touch controller of claim 7, wherein the logic is configured to:
determine a location of an object interacting with the touch sensor panel; and
determine which of the plurality of touch pixel electrodes is the first plurality of touch pixel electrodes and which of the plurality of touch pixel electrodes is the second plurality of touch pixel electrodes based on the determined location of the object.

11. The touch controller of claim 10, wherein the logic is configured to:
prior to determining the location of the object, initiate an initial scan of the touch sensor panel in which the first plurality of touch pixel electrodes and the second plurality of touch pixel electrodes are driven and sensed simultaneously; and
determine the location of the object based on the initial scan.

12. The touch controller of claim 1, wherein the reference voltage the first and second voltage signals are out of phase.

13. A method of operating a touch sensor panel, the touch sensor panel including a plurality of touch pixel electrodes arranged in rows on the touch sensor panel, each touch pixel electrode of the plurality of touch pixel electrodes corresponding to a unique horizontal and a unique vertical position on the touch sensor panel, the method comprising:
during a first time period:
driving and sensing self-capacitances of a first plurality of touch pixel electrodes of the plurality of touch pixel electrodes on the touch sensor panel using a first voltage signal while concurrently driving a second plurality of touch pixel electrodes of the plurality of touch pixel electrodes on the touch sensor panel at a reference voltage, different from the first voltage signal; and
during a second time period:
driving and sensing self-capacitances of the second plurality of touch pixel electrodes of the plurality of touch pixel electrodes using a second voltage signal while concurrently driving the first plurality of touch pixel electrodes of the plurality of touch pixel electrodes at the reference voltage, different from the second voltage signal, wherein each row of the rows of touch pixel electrodes on the touch sensor panel includes touch pixel electrodes from the first plurality of touch pixel electrodes and touch pixel electrodes from the second plurality of touch pixel electrodes alternately arranged along the row.

14. The method of claim 13, wherein driving the first plurality of touch pixel electrodes and the second plurality of touch pixel electrodes, respectively, at the reference voltage comprises driving the first plurality of touch pixel electrodes and the second plurality of touch pixel electrodes, respectively, at a system ground of the touch sensor panel.

15. The method of claim 13, wherein:
the plurality of touch pixel electrodes on the touch sensor panel are arranged in the rows and in columns on the touch sensor panel, and
the first plurality of touch pixel electrodes and the second plurality of touch pixel electrodes are arranged in a checkerboard pattern alternating in two dimensions on the touch sensor panel such that:
each row of the rows of touch pixel electrodes on the touch sensor panel includes touch pixel electrodes from the first plurality of touch pixel electrodes and touch pixel electrodes from the second plurality of touch pixel electrodes alternately arranged along the row, and
each column of the columns of touch pixel electrodes on the touch sensor panel includes touch pixel electrodes from the first plurality of touch pixel electrodes and touch pixel electrodes from the second plurality of touch pixel electrodes alternately arranged along the column.

16. The method of claim 15, further comprising:
coupling the first plurality of touch pixel electrodes to the sense circuitry using a first set of routing on the touch sensor panel; and
coupling the second plurality of touch pixel electrodes to the sense circuitry using a second set of routing on the touch sensor panel,
wherein the first set of routing and the second set of routing are alternately disposed between columns of touch pixel electrodes on the touch sensor panel such that the first set of routing and the second set of routing are not both disposed between any two adjacent columns of the columns of touch pixel electrodes on the touch sensor panel.

17. The method of claim 13, wherein one or more distances between touch pixel electrodes in the first plurality of touch pixel electrodes are substantially the same as one or more distances between touch pixel electrodes in the second plurality of touch pixel electrodes.

18. The method of claim 13, further comprising:
driving and sensing multiple other pluralities of touch pixel electrodes on the touch sensor panel during other respective time periods, the multiple other pluralities of touch pixel electrodes being different than the first and second pluralities of touch pixel electrodes, and the other respective time periods being different than the first and second time periods.

19. The method of claim 13, further comprising:
dynamically determining which of the plurality of touch pixel electrodes is the first plurality of touch pixel electrodes and which of the plurality of touch pixel electrodes is the second plurality of touch pixel electrodes to be driven and have their self-capacitances sensed by the sense circuitry.

20. The method of claim 19, wherein dynamically determining which of the plurality of touch pixel electrodes is the first plurality of touch pixel electrodes and which of the plurality of touch pixel electrodes is the second plurality of touch pixel electrodes comprises:
determining a size of an object interacting with the touch sensor panel; and
determining which of the plurality of touch pixel electrodes is the first plurality of touch pixel electrodes and which of the plurality of touch pixel electrodes is the second plurality of touch pixel electrodes based on the determined size of the object.

21. The method of claim 20, further comprising:
prior to determining the size of the object, initiating an initial scan of the touch sensor panel in which the first plurality of touch pixel electrodes and the second plurality of touch pixel electrodes are driven and have their self-capacitances sensed simultaneously; and
determining the size of the object based on the initial scan.

22. The method of claim 19, wherein dynamically determining which of the plurality of touch pixel electrodes is the first plurality of touch pixel electrodes and which of the plurality of touch pixel electrodes is the second plurality of touch pixel electrodes comprises:
determining a location of an object interacting with the touch sensor panel; and
determining which of the plurality of touch pixel electrodes is the first plurality of touch pixel electrodes and which of the plurality of touch pixel electrodes is the second plurality of touch pixel electrodes based on the determined location of the object.

23. The method of claim 22, further comprising:
prior to determining the location of the object, initiating an initial scan of the touch sensor panel in which the first plurality of touch pixel electrodes and the second plurality of touch pixel electrodes are driven and have their self-capacitances sensed simultaneously; and
determining the location of the object based on the initial scan.

24. The method of claim 13, wherein the reference voltage the first and second voltage signals are out of phase.

* * * * *